(12) United States Patent
Nessel et al.

(10) Patent No.: US 8,410,469 B2
(45) Date of Patent: Apr. 2, 2013

(54) CHALCOGENIDE NANOIONIC-BASED RADIO FREQUENCY SWITCH

(75) Inventors: James Nessel, Hinckley, OH (US); Richard Lee, Ann Arbor, MI (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 13/050,229

(22) Filed: Mar. 17, 2011

(65) Prior Publication Data

US 2011/0162950 A1     Jul. 7, 2011

Related U.S. Application Data

(63) Continuation of application No. 12/336,503, filed on Dec. 16, 2008, now Pat. No. 7,923,715.

(51) Int. Cl.
*H01L 45/00* (2006.01)
(52) U.S. Cl. .................................. 257/4; 257/E45.002
(58) Field of Classification Search .................. 257/2, 3, 257/4, E45.002; 365/182
See application file for complete search history.

(56) References Cited

U.S. PATENT DOCUMENTS 6,469,364 B1* 10/2002 Kozicki .......................... 257/529
2006/0164880 A1* 7/2006 Sakamoto et al. ............. 365/153

OTHER PUBLICATIONS

Nessel et al., "A novel nanoionics-based switch for microwave applications" J. Microwave Symposium Digest, 2008, pp. 1051-1054.*

* cited by examiner

*Primary Examiner* — Thomas L Dickey
(74) *Attorney, Agent, or Firm* — Robert H. Earp, III

(57) ABSTRACT

A nonvolatile nanoionic switch is disclosed. A thin layer of chalcogenide glass engages a substrate and a metal selected from the group of silver and copper photo-dissolved in the chalcogenide glass. A first oxidizable electrode and a second inert electrode engage the chalcogenide glass and are spaced apart from each other forming a gap therebetween. A direct current voltage source is applied with positive polarity applied to the oxidizable electrode and negative polarity applied to the inert electrode which electrodeposits silver or copper across the gap closing the switch. Reversing the polarity of the switch dissolves the electrodeposited metal and returns it to the oxidizable electrode. A capacitor arrangement may be formed with the same structure and process.

11 Claims, 15 Drawing Sheets

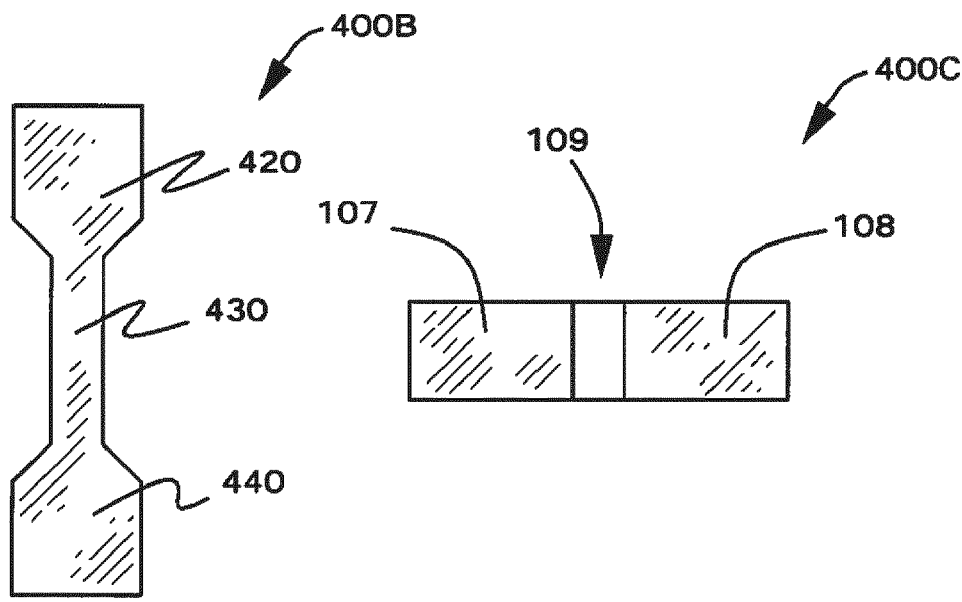
FIG. 4B
FIG. 4C
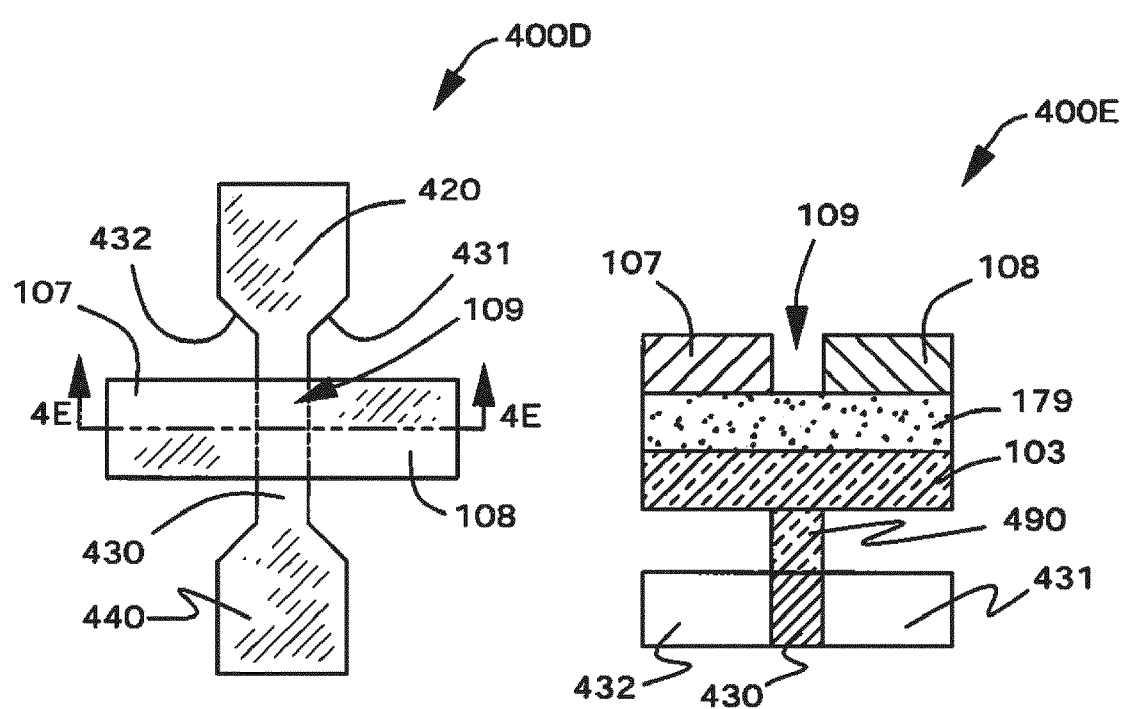
FIG. 4D
FIG. 4E

|  | MEMS | Solid State | Nanoionics |
|---|---|---|---|
| Frequency Range | DC to 70 GHz | DC to 20 GHz | DC to 6 GHz |
| Insertion Loss (avg) | 0.1 dB | 0.5 dB | 0.5 dB |
| Isolation (avg) | 40 dB | 30 dB | 35 dB |
| Actuation Voltage | 5 - 50 V | 3 - 5 V | 1 V |
| Power Consumption | μW | mW | μW |
| Energy Consumption | 0.1 – 10 μJ | μJ – mJ | 100 nJ |
| Power Handling | 1 - 20 W | 1 - 10 W | 0.5 W |
| Intermodulation Distortion | +80 dBm | +70 dBm | +75 dBm |
| Switching Speed | 1 – 200 μs | 10 - 100 ns | < 1 – 10 μs |
| Size | $\mu m^2$ | $nm^2 - \mu m^2$ | $nm^2 - \mu m^2$ |
| Unit Cost | ~ $5 | ~ $0.50 | ~ $0.50 |

FIG. 8

CHALCOGENIDE NANOIONIC-BASED RADIO FREQUENCY SWITCH

CROSS-REFERENCE TO RELATED APPLICATIONS

This application is a continuation claiming the benefit of priority from U.S. patent application Ser. No. 12/336,503 filed on Dec. 16, 2008 now U.S. Pat. No. 7,923,715, which is hereby incorporated by reference herein.

FIELD OF THE INVENTION

The invention is in the field of chalcogenide nanoionic based radio frequency switches.

BACKGROUND OF THE INVENTION

Radio frequency switches are basic building blocks for communication and control systems and are used for multiplexing of signals to achieve system reconfigureability and dynamic control. Radio frequency switches may be used in such applications as portable/mobile/satellite communication systems (e.g. cell-phones, PDAs, laptops, phased array antennas, sensors, transceivers etc.). As communication systems approach higher data rate (Giga Bytes per second) and multi-functional operation, stringent requirements are placed on radio frequency switches. Some of these requirements include low power consumption, high reliability, high switching speed, high isolation, low insertion losses, ease of integration/implementation, as well as affordability. In particular, for 3 G (third generation) wireless phones and space-based applications, low power consumption is critical to ensure reliable, long lifetime operation on limited power supplies. MEMS or solid-state based switches which are currently used are incapable of meeting future demands due to associated disadvantages. MEMS devices utilize complicated manufacturing processes and are expensive to make. See FIG. 8, FIG. 8 is a table comparing electronic, physical and cost properties of MEMS, Solid State, and Nanoionics switches.

The present state-of-the-art radio frequency devices employ electronic, mechanical, or a combination of the two (electromechanical) processes to induce a change in state (on/off). Radio frequency switching applications usually employ solid state switches diodes, FETs) or microelectromechanical systems (MEMS), both of which possess associated weaknesses. Solid state diodes can be produced cost-effectively to operate at low voltages (1-3V) and high speeds (ns), but suffer from higher insertion loss, high DC power consumption, low isolation, and the generation of third-order harmonics/intermodulation distortion (IMD). MEMS-based switches provide low insertion loss (~0.2 dB), low DC power consumption (~pW), high isolation (>30 dB), and good IMD performance, but exhibit reliability problems (e.g., stiction, moving parts), slower switching speeds (ps), high actuation voltages (5-50V) which require complex circuitry, and relatively complicated processing steps. Furthermore, MEMS packaging presents additional problems which need to be addressed before widespread use is realizable.

Chalcogenide glasses contain a large number of group VI or "chalcogen" atoms (S, Se, Te and O) and have a wide range of physical characteristics. Stable binary glasses typically involve a group IV or group V atom, such as Ge—Se or As—S. Non-oxide glasses usually are more rigid than organic polymers but more flexible than a typical oxide glass. The flexibility of these materials offers the possibility of the formation of voids through which the ions can readily move from one equilibrium position to another. The addition of Ag or Cu (Group I elements) transforms the chalcogenide glass into an electrolyte as these metals form mobile ions within the material. The ions are associated with the chalcogen atoms. The high dielectric constant of the glass materials (typically around 10), reduces the coulombic attractive forces between the charged species and allows high ionic mobility. The conductivity of the ternary glasses is a strong function of the mobile ion concentration. "Ternary" generally means a compound having three elements.

"The transformation that occurs in ternary electrolytes at over a few atomic percent of metal is not a subtle one by any means. Indeed, the material undergoes considerable changes in its nanostructure that have a profound effect on its macroscopic characteristics. These changes are a result of phase separation caused by the reaction of silver with the available chalcogen in the host to form distinct regions of $Ag_2Se$ in Ag—Ge—Se and $Ag_2S$ in Ag—Ge—S ternaries." See, Devices based on mass transport in solid electrolytes, Michael N. Kozicki and Maria Mitkova, Center for Applied Nanoionics, Arizona State University.

"The addition of Ag (or Cu) to the chalcogenide base glass can be achieved by diffusing the mobile metal from a thin surface film via photo dissolution. The process utilizes light energy greater than the optical gap of the chalcogenide glass to create charged defects near the interface between the reacted and un reacted chalcogenide layers. The holes created are trapped by the metal while the electrons move into the chalcogenide film. The electric field formed by the negatively charged chalcogen atoms and positively charged metal ions is sufficient to allow the ions to overcome the energy barrier at the interface and so the metal moves into the chalcogenide. Prior to the introduction of the metal, the glass consists of $GeS_4$ ($GeSe_4$) tetrahedra and, in the case of chalcogen-rich material, S (Se) chains. The introduced metal will readily react with the chain chalcogen and some of the tetrahedral material to form the ternary. This Ag chalcogen reaction, which essentially nucleates on the chalcogen-rich regions within the base glass, results in the nanoscale phase-separated ternary." See, Devices based on mass transport in solid electrolytes, Michael N. Kozicki and Maria Mitkova, Center for Applied Nanoionics, Arizona State University.

Nanoionics concerns itself with materials and devices that rely on ion transport and chemical change at the nanoscale. The chemical change takes the form of an oxidation/reduction reaction of ionic metal species within some base material to essentially "grow" metal on the surface (or within a film) at low energies.

SUMMARY OF THE INVENTION

A nonvolatile nanoionic switch is disclosed. A thin layer of chalcogenide glass engages a substrate and a metal selected from the group of silver and copper photo dissolved in the chalcogenide glass. A first oxidizable electrode and a second inert electrode engage the chalcogenide glass and are spaced apart from each other forming a gap therebetween. A direct current voltage source is applied with positive polarity applied to the oxidizable electrode and negative polarity applied to the inert electrode which electrodeposits silver or copper across the gap closing the switch. Reversing the polarity of the switch dissolves the electrodeposited metal and returns it to the oxidizable electrode. A capacitor arrangement may be formed with the same structure and process.

The nanoionic switch includes a substrate and a solid electrolyte ternary. The solid electrolyte ternary includes a chalcogenide glass engaging the substrate. The chalcogenide glass includes a metal selected from the group of silver and copper photo dissolved in the chalcogenide glass. A first oxidizable electrode and a second inert electrode are placed on the ternary. The first oxidizable electrode and the second inert electrode reside atop and engage the chalcogenide glass and are spaced apart from each other forming a small gap therebetween. A voltage source is applied to the first and second electrodes. The chalcogenide glass is selected from the group of Ge—Se, Ge—S, and Si—O binaries and is saturated with an amount of the metal selected from the group of silver and copper photo-dissolved in the chalcogenide glass.

The first oxidizable electrode is a preferably silver (or copper) electrode and the second electrode is a nickel electrode. The first oxidizable electrode could be a copper electrode and the second inert electrode could be a tungsten electrode. The first silver (or copper) oxidizable electrode includes a gold plating thereover as does the second nickel electrode to reduce ohmic losses. The voltage source is a direct current voltage source interconnecting a direct current bias across the oxidizable and inert electrodes of the switch. The direct current bias is oriented across the switch by applying positive bias to the oxidizable electrode and applying relative negative bias to the inert electrode. The switch is nonvolatile meaning that once it is made up it does not require a constant bias voltage to maintain the switch in the closed or "on" state. Since energy does not have to supplied constantly to maintain the switch in the closed state this results in a large energy savings.

A second voltage source is applied to the first and second electrodes and the second voltage source may be an alternating current voltage source. The second voltage source is applied after the direct current bias has closed the switch. Bias voltages of between 0.3 volts dc to 1 volt dc may be used. Biases of up to 3 Vdc are realizable. The switching time is 1-10 µseconds which corresponds to a frequency of 1 Mhz to 100 khz. It is possible to bias the switch to the closed or open position if a low frequency alternating current signal with sufficient voltage is used. However, the switch has functionality through direct current biasing and passage of frequencies at or above 1 Mhz.

When the switch is made up the electrodeposit of metal selected from the group of silver and copper photo-dissolved in the chalcogenide glass includes silver (or copper) in and on the chalcogenide glass bridging the electrodes thus creating electrically conductive paths across the gap in the form of filaments. The gap is approximately 10 µm although other gaps in the range of 1-500 µm may be used. The chalcogenide glass ternary is relatively thin and is approximately 50 to 100 nm thick while the electrodes are approximately 1.5 to 2 µm thick which is still thin but considerably thicker than the glass ternary. A nanoionic switch may include first and second electrodes wherein each electrode includes a wide portion, a tapered portion and a narrow portion sized as a function of the frequency of the alternating current signal. The wide portions are approximately 1 mm wide, the tapered angles are 22.5°, and the narrow portions are 10 µm wide and these work well at the frequencies of interest. The geometry of the transmission line is important in reducing, insertion loss.

A method of using a nanoionic switch is disclosed and claimed. The switch includes a substrate and a chalcogenide glass engaging the substrate. The chalcogenide glass includes a metal selected from the group of silver and copper photo-dissolved in the chalcogenide glass, a first oxidizable electrode and a second inert electrode. The first oxidizable electrode and the second inert electrode engage the chalcogenide glass and are spaced apart from each other forming a gap therebetween. The method includes the steps of applying a direct current bias across the oxidizable and inert electrodes of the switch and orienting the direct current bias across the switch by applying positive bias to the oxidizable electrode and applying relative negative bias to the inert electrode. Further steps of the process include electrodepositing the metal selected from the group of silver and copper across the gap between the oxidizable electrode and the inert electrode bridging the switch and closing the switch.

Further steps of the process include reversing the polarity of the voltage source applying positive bias to the inert electrode and applying negative bias to the oxidizable electrode. Reversing the polarity includes the step of dissolving the electrodeposited metal and returning the metal to the oxidizable electrode resetting the switch to an open state. An alternating current signal in the range of 1 MHz to 6 Ghz (less than 0.3V rms) may be passed through the electrodes once the switch is closed. Once the direct current bias across the oxidizable and inert electrodes of the switch is removed the switch is in a nonvolatile state and an alternating current signal in the range of 1 MHz to 6 Ghz and less than 0.3-1V rms may be passed through the switch.

The switch may be modified to include a substrate; a solid electrolyte ternary, the solid electrolyte ternary includes a chalcogenide glass engaging the substrate; the chalcogenide glass includes a metal selected from the group of silver and copper photo-dissolved in the chalcogenide glass; a first oxidizable electrode and a plurality of inert electrodes, the first oxidizable electrode and the plurality of the inert electrodes reside atop and engage the chalcogenide glass and are spaced apart from each other forming gaps therebetween. Then, a relatively positive voltage is applied to the first oxidizable electrode and, selectively, a relatively negative voltage is applied to one of the plurality of the inert electrodes. A plurality of inert delay lines may be interconnected with an oxidizable pole. In this way a single pole n-throw switch is formed which is capable of communication in both the vertical and horizontal planes.

A nanoionic capacitor is also disclosed and claimed. Plural capacitors may be also formed as those skilled in the art will readily recognize. A substrate includes a solid electrolyte ternary residing thereon. The solid electrolyte ternary includes a chalcogenide glass doped with silver (or copper) engaging the substrate. The chalcogenide glass includes a metal selected from the group of silver and copper photo-dissolved in the chalcogenide glass which upon dissolution forms the ternary. A first oxidizable electrode and a second inert electrode are employed. The first oxidizable electrode and the second inert electrode reside atop and engage the chalcogenide glass and are spaced apart from each other forming a gap therebetween. A voltage source is applied to the first and second electrodes. A first capacitor plate is formed and includes an electrodeposit growing on the chalcogenide glass between the first and second electrodes when the voltage source is applied with relatively positive voltage to applied to the first oxidizable electrode and relatively negative voltage is applied to the second inert electrode. A second capacitor plate resides in proximity to the first capacitor plate. The second capacitor plate of the second capacitor has a shape which matches the shape of the first capacitor plate formed by the electrodeposit in the gap between the electrodes.

The invention includes an ionic switching device for use in radio frequency (RF) systems and subsystems, such as phase shifters for electronically steerable phased array antennas, cellular telephones, transceivers multiplexer, reconfigurable communications systems, mobile wireless portable electronics, or any radio frequency device which employs switching.

The radio frequency switching device utilizes a new switching mechanism based on integrated nanoionics (with no mechanical moving parts). In comparison to the state-of-practice based on solid-state or micro-electromechanical systems (MEMS), the nanoionic-based switch of this invention has demonstrated comparable RF performance, low power consumption, high speed operation, and cost effectiveness. The ionic switch of nanoscale dimension can be fabricated using conventional integrated circuit techniques (including inkjet printing) to achieve low fabrication costs. Further, the ionic switch requires fewer bias operations, lacks the complex voltage up-conversion circuitry of MEMS switches, and may use a simple planar structure allowing easy integration into any radio frequency power distribution circuit. Due to the simplified geometry of the nanoionic switch, multipart switches (e.g., single-pole-quadruple-throw (SP4T), single-pole-eight-throw (SP8T), single-pole-N-throw) are easily made which would be extremely difficult to develop using other approaches.

The switch disclosed and claimed utilizes an electrochemical process to switch states, which has several inherent advantages. First, the process is non-volatile, meaning no power is required to maintain a particular state ("on" or "off"), but only to change states. The ionic switch is comparable in speed to the solid state electronic processes. There are no moving parts as in MEMS devices eliminating this point of failure and further enhancing reliability and speed.

Also, the fabrication process of nanoionics-based switches is relatively simple compared to the manufacture of MEMS based designs. A binary compound chalcogenide glass is photo dissolved with silver (or copper) ions between a gap in the transmission line which forms a ternary. Compared to solid state and MEMS devices, which may require several sacrificial layers and masks, a nanoionic switch is easy to manufacture at reduced cost due to its simplicity. The ionic switch overcomes many of the problems inherent in MEMS switches which rely on a mechanical motion for changing state. The metallization/growth process circumvents RF performance limitations associated with solid state switches.

Integrated nanoionics is based on the phenomenon of fast ion transport in solids. Some amorphous materials can incorporate relatively large amounts of metal therein and behave as solid electrolytes. The ionic conductivity of these materials can be of the same order of magnitude as the electronic conductivity in semiconductors. Under appropriate bias conditions (>0.3-1V), metal ions present in the solid electrolyte undergo reduction due to electron injection from the cathode to induce metallic growth between the two electrodes. Once a conductive pathway is formed, no further power is required to maintain the connection (for example, it is non-volatile). The process can then be easily reversed through the application of a reverse bias to recreate the insulating amorphous layer, thus acting as an electrochemical switch. The electrochemical switch of the invention can be fabricated at nanoscale dimensions and operated at the nanosecond switching rates.

The relationship between electricity and chemical change is referred to as electrochemistry. Oxidation of an electron creates ions which are able to move under the influence of an electric field in ion conducting materials referred to as electrolytes. On receiving an electron, a displaced ion is reduced and becomes an atom. Mass is able to moved or redistributed as a function of energy from an external power source such as a direct current or alternating current power source. Movement of mass can be used in a multitude of applications. By moving mass, nanoionic switches, capacitors and transistors are created. Specifically, the movement of a metal mass is used to bridge a high resistance region between two terminals, thereby creating an electrochemical switch.

A highly stable solid electrolyte is created by combining Ge with S or Se to form a base glass into which silver (Ag) is dissolved thus creating a ternary (a three element compound). Silver metal (referred to as a mobile metal) is dissolved into the base glass. A thin surface film of silver is dissolved into a chalcogen base glass via photo-dissolution. The process utilizes light energy (ultra violet light) which is greater than the optical gap of the chalcogenide glass to promote photochemical diffusion. The introduced silver reacts with the chalcogen base glass to form the ternary electrolyte. This Ag chalcogen reaction essentially nucleates on the chalcogen-rich regions within the base glass and results in a ternary that takes the form of a dispersed nanoscale metal ion-rich phase in a continuous glassy Ge-rich matrix. This allows the electrolyte to have a relatively high resistivity (necessary for a high "off" resistance state), while containing large quantities of highly mobile metal ions for completion or "making" of the switch.

An ion flow will only occur in an electrolyte if an oxidizable metal electrode (for example a silver electrode) is made positive (i.e., is made the anode) with respect to an opposing electrode (cathode) and sufficient bias is applied. The bias may be on the order of a few tenths of a volt up to 1 volt or more. The number of atoms electro-deposited (grown) by the reduction of ions will correspond to the number of electrons that take part in the process determined by the external circuit (for example, a voltage source).

Each metal ion being reduced is balanced by the oxidation of a metal atom from the cathode and this avoids the formation of an internal electric field due to the build up of charge which would ultimately cancel the applied field and halt the electrodeposition. If the cathodic electrode is electrochemically inert (not oxidizable), then the electrodeposition process is reversible by reversing the bias of the energy source. It is possible to use an oxidizable electrode as the cathode.

When the electro-deposit is made positive with respect to the original oxidizable electrode by reversing the bias of the energy source (usually a direct current or alternating current source) it becomes the oxidizable electrode and dissolves. During the dissolution of the electrodeposit, the metal is returned to the oxidizable electrode (silver electrode). Once the electrodeposit has been completely dissolved, the metal is returned to its source (silver electrode) and the process terminates. It is important to note that it is the asymmetry of the device (an oxidizable electrode and one inert electrode) that allows the deposition-dissolution process to be cycled repeatedly.

A series switch of coplanar or multilayer geometry is disclosed. Alternate geometry is also disclosed which includes the shunt or capacitor-type of switches which are based on the same integrated nanoionics technology. The nanoionics-based switching technology disclosed and claimed herein provides the unique capability of readily providing multi-port switching, of switching through multiple layers (vertically versus purely horizontally), which is of great advantage to circuit designers and results in a smaller electronic circuitry footprint. No other known switch technology produces these results with the performance stated herein at costs stated herein.

The nanoionic switch disclosed and claimed herein demonstrates comparable radio frequency performance, low power consumption, high speed operation and cost effectiveness in comparison to the prior art MEMS and solid state switches. Measured and simulated results for the nanoionics-based switch indicate an insertion loss of −0.5 dB, isolation of ≧30 dB, low voltage operation (0.3-1 Volt), high speeds (µs), low power (μWatt) and low energy (nJ, nano-Joules) and excellent intermodulation distortion (IMD) response.

Solid state devices need mW of power and have poorer radio frequency operation relative to MEMS. Solid state switches, however, have good RF performance. Therefore, in order to combine the superior radio frequency performance and low power consumption of MEMS with the high speed operation and low cost of solid state devices, a radically new approach based on integrated nanoionics is desirable.

The need for low power, high speed switching technology for future mobile and terrestrial/non-terrestrial communications systems is paramount. Presently, switches used in communication devices involve trade-offs between several metrics of a good radio frequency switch. For example, solid state devices can operate at high speeds, but consume much power and tend to have poorer radio frequency performance characteristics. MEMS switches operate at low power levels, but are slower and less reliable.

Potential commercial applications of the invention include: mobile wireless devices; transmit/receive communications systems; phased array antenna systems; phase shifters; reconfigurable microwave components (e.g., multiplexers, filters, resonators, etc.); and, reconfigurable antennas.

It is an object of the invention to provide simple electrochemical switches.

It is an object of the invention to provide electrochemical switches which consume a small amount of power.

It is a further object of the invention to provide nonvolatile electrochemical switches.

It is an object of the invention to provide electrochemical switches operable at low voltages.

It is a further object of the invention to provide nanoscale electrochemical switches at low cost which are easy to fabricate.

It is a further object of the invention to provide electrochemical switches having low insertion loss in the on state (closed switch) and high power isolation in the "off" state (open switch).

It is a further object of the invention to provide a nonvolatile nanoionic switch which once energized with sufficient direct current voltage for a sufficient amount of time and with the positive voltage applied to the oxidizable electrode (anode) and the negative voltage applied to the inert electrode (cathode) requires no further energy to sustain the nanoionic switch in the closed position so that it may pass control signals of sufficiently high frequency having sufficiently low (root mean square) alternating current voltage.

It is a further object of the invention to provide a nonvolatile nanoionic switch which once energized with sufficient direct current voltage for a sufficient amount of time and with the positive voltage applied to the oxidizable electrode (anode) and the negative voltage applied to the inert electrode (cathode) requires no further energy to sustain the nanoionic switch in the closed position so that it may pass control signals of sufficiently high frequency having sufficiently low (root mean square) alternating current voltage.

BRIEF DESCRIPTION OF THE DRAWINGS

The patent or patent application file contains at least one microphotograph and atomic force microphotograph executed in color. Copies of this patent or patent application publication with microphotographs will be provided by the Patent Office upon request and payment of the necessary fee.

FIGS. 4B-4E form a second example of a nanoionic capacitor wherein FIG. 4B is a top schematic view of the lower plate of a nanoionic capacitor.

FIG. 4C is a top schematic view of the second example of a nanoionic switch which forms one of the two capacitor plates of the example of the nanoionic capacitor schematically illustrated in FIGS. 4B-4E.

FIG. 4D is a top schematic view of the capacitor plates illustrated in the overlapping position crossing each other in an orthogonal relationship.

FIG. 4E is a cross-sectional view of the second example of the nanoionic capacitor taken along the lines 4E-4E of FIG. 4D.

FIG. 8 is a table comparing electronic, physical and cost properties of MEMS, Solid State, and Nanoionics switches.

DESCRIPTION OF THE INVENTION

The fabrication of the nanoionics-based switch is described. A substrate (for example, having high resistivity (>1000 Ohm/cm silicon wafer) is deposited with a layer of binary chalcogenide glass (Col. IV and Col. VI element of the periodic table, e.g., Ge—Se, Ge—S, Si—O). Next, a layer of silver is deposited atop the glass and exposed to ultra violet light to induce a photo-dissolution process. Silver ions migrate into the glass matrix providing the framework for ionic transport and the capability of switching between a kw loss "on" state and a high isolation "off" state. Electrodes of dissimilar metals, one silver (oxidizable) and one inert (e.g., nickel) are deposited atop the chalcogenide layer to complete the switch. The switch also includes a passivation layer to protect it from the environment.

The electrochemical resistance-change process requires very little energy. Electrolytes are formed in a two step process in which a binary (Ge—Se, Ge—S, Si—O) base glass is deposited first and then a thin silver film is applied thereto. Then the two layers are combined by photo-dissolution. The Ge and Se content of the binary will range from 30 to 40 percent by weight. The glass deposition is evaporated in a vacuum performed at or near room temperature. Silver deposition is also performed using evaporation without breaking vacuum so as to prevent the formation of an oxide diffusion barrier on the surface of the glass. The thicknesses of both layers will largely depend on device performance requirements.

In the photo-dissolution process used for the nanoionic switch, an ultra violet source with wavelength of 405 nm and power density around 5 mW/cm$^2$ is applied for 10 minutes. The silver film thickness is kept to less than 25 nm to allow sufficient light to penetrate to the interface to stimulate the photo-dissolution process in a reasonable amount of time. "Saturation" of the base glass occurs when the diffusing silver reacts with all available chalcogen atoms and so the amount of Ag at saturation actually depends on the amount of chalcogen in the base glass. A 20 nm thick silver film will completely saturate a 50 nm thick film of base glass when the photo-dissolution is completed. "Sub-saturated" electrolytes support electro-deposition but growth rates are typically reduced as there is obviously less Ag available. Electrolyte films as thin as 10 nm can be used for surface electro-deposition.

Figure 6:
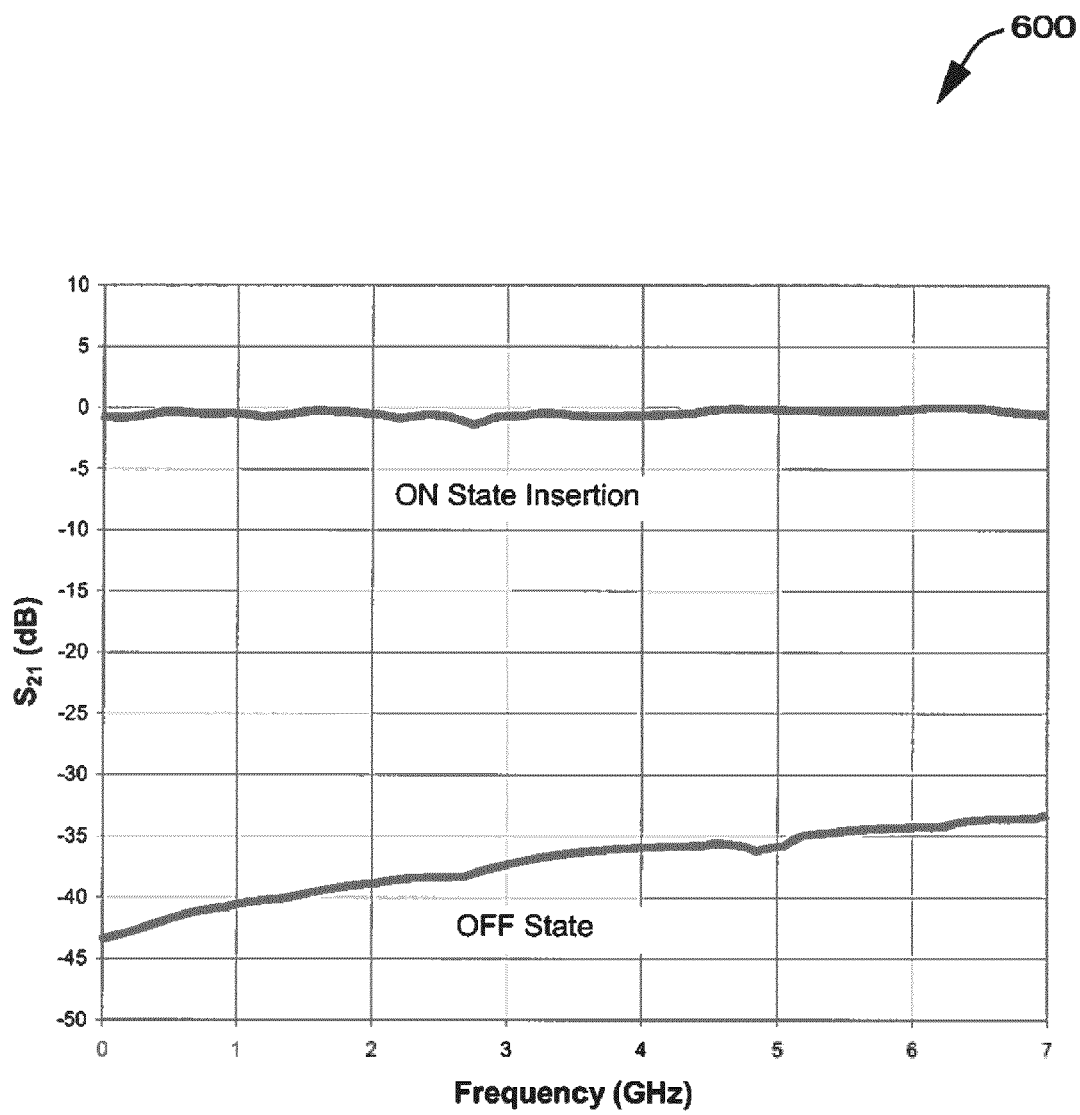
FIG. 6 is a plot of insertion loss (switch closed or "on") and the isolation (switch open or "off") for frequencies between 1 and 6 Ghz.
Figure 7:
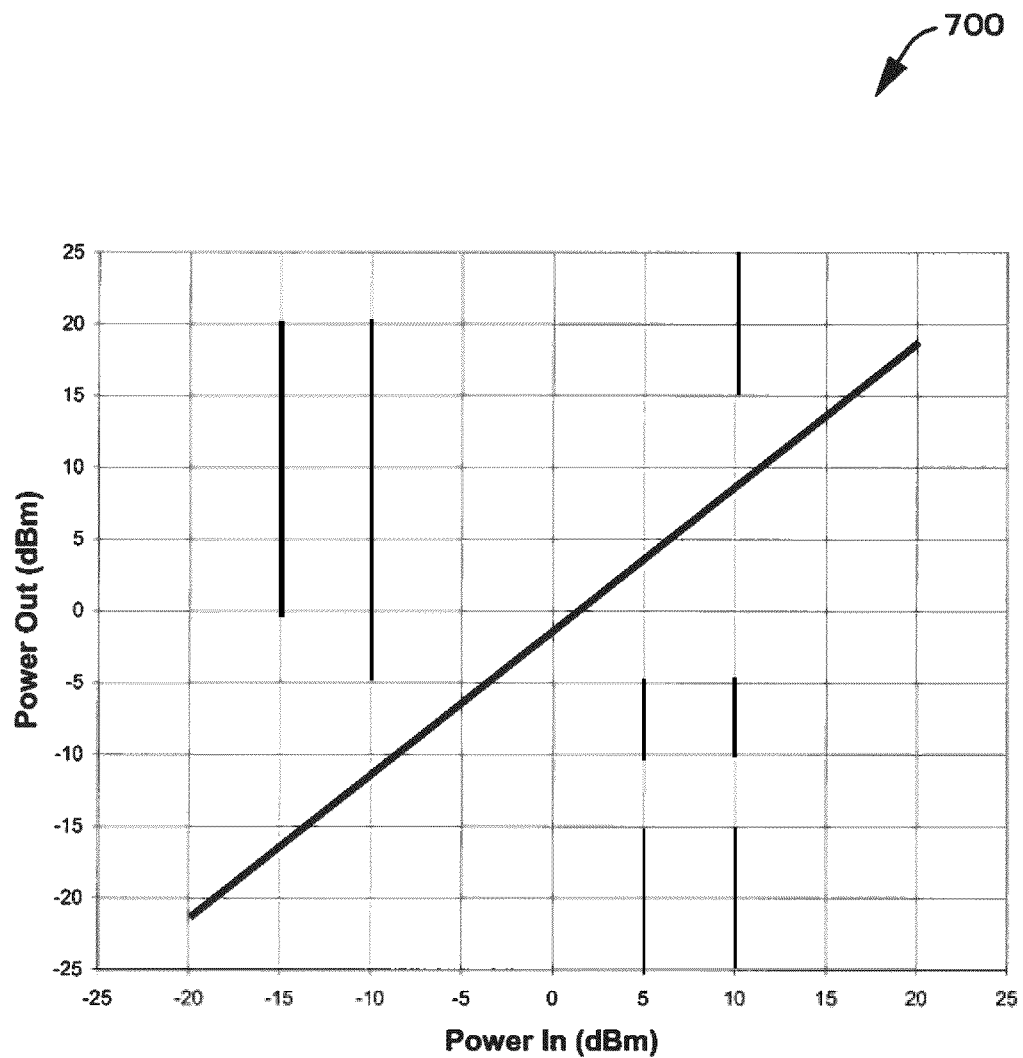
FIG. 7 is a generalized plot of power in versus power out for four frequencies (500 MHZ, 1 GHz, 2 GHz and 4 GHz).

The measured insertion loss ("on"), isolation ("off") and power transfer curves for the nanoionics-based switch are shown in FIGS. 6 and 7, respectively. The switch operates as follows: applying a voltage of 0.3-1 and a current of μA to mA, a low loss conductive pathway forms in the chalcogenide glass between the two electrodes. See FIG. 2D which illustrates the actual growth of the electrodeposits. This process occurs via an oxidation-reduction reaction. Silver (or copper) is oxidized at the silver (or copper) electrode to form silver (or copper) ions. The silver ions (Ag$^+$) migrate into the glass while electrons are simultaneously injected at the opposite inert electrode (nickel electrode). This combination ionic-electronic process induces a reduction reaction within the chalcogenide to form silver metal which responds to an electric field and "grows" across this gap until the power limit applied is reached. No further power is then required to maintain the "on" state of the switch. To reverse this process, the polarity of the applied voltage is reversed and the electrochemically grown silver within the gap oxidizes, returning the device to the "off" state.

Figure 1:
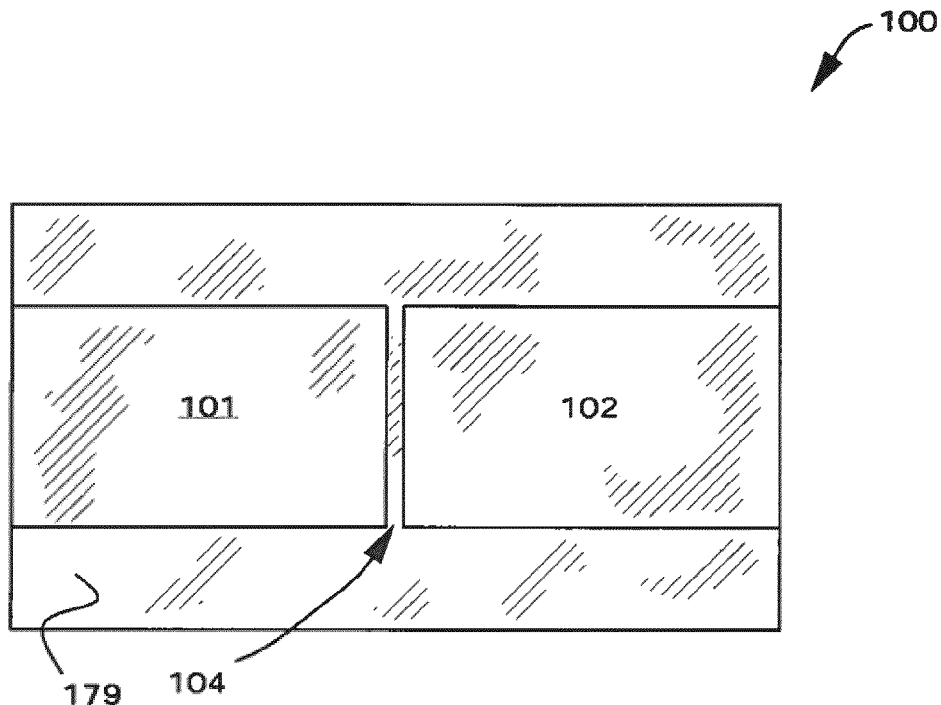
FIG. 1 is a schematic top view of the first example of a nanoionic switch.
Figure 2:
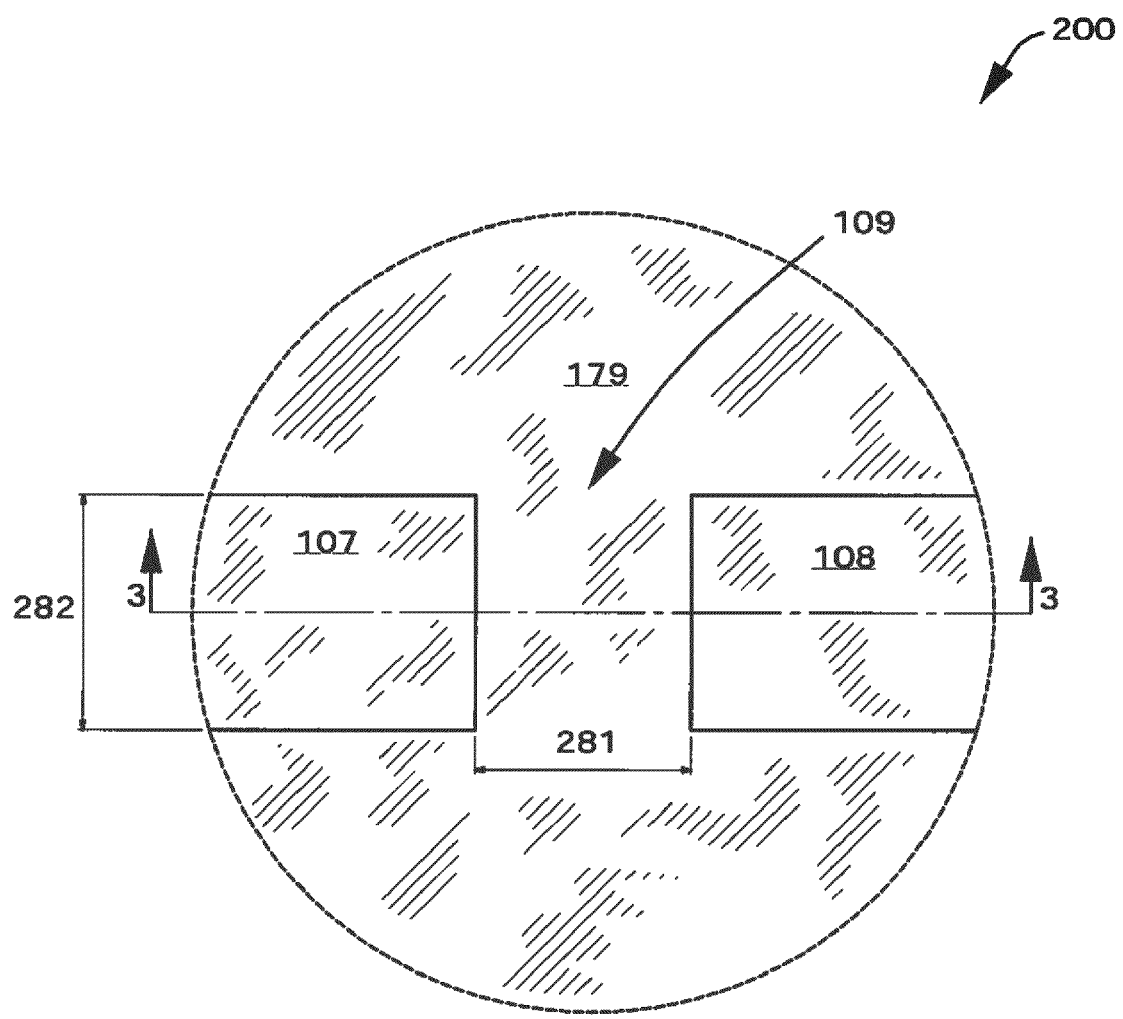
FIG. 2 is an enlargement of a portion of FIG. 1A illustrating a gap between the electrodes.
Figure 2A:
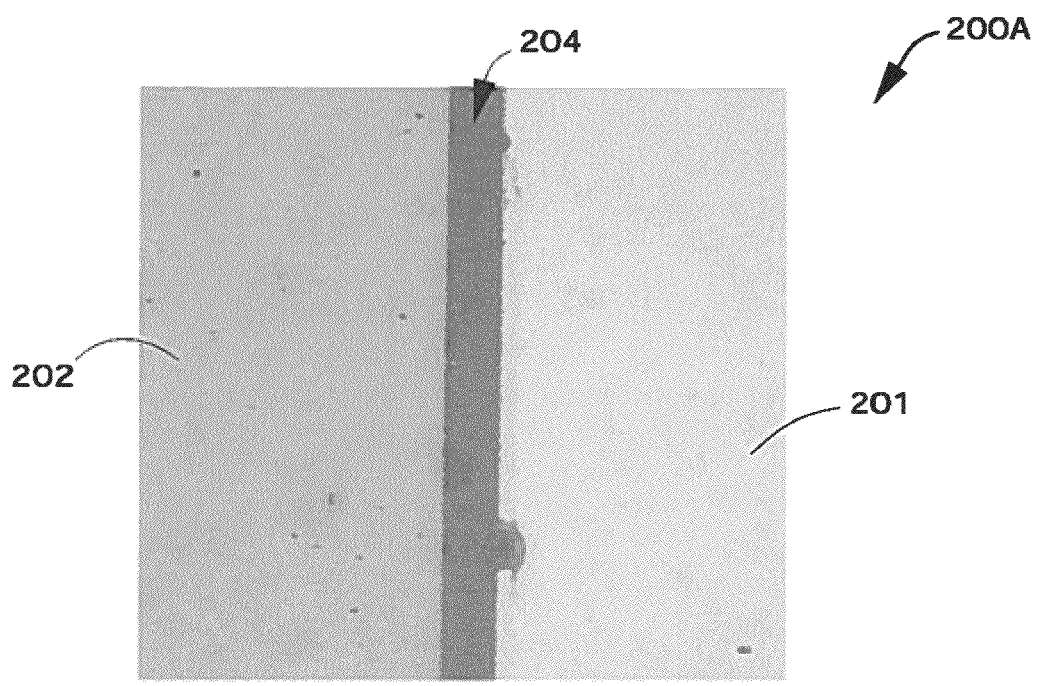
FIG. 2A is a microphotograph of a portion of the silver and nickel electrodes and the gap of an actual nanoionic switch (depicted schematically in FIG. 1) in the "off" state (switch is open).
Figure 2B:
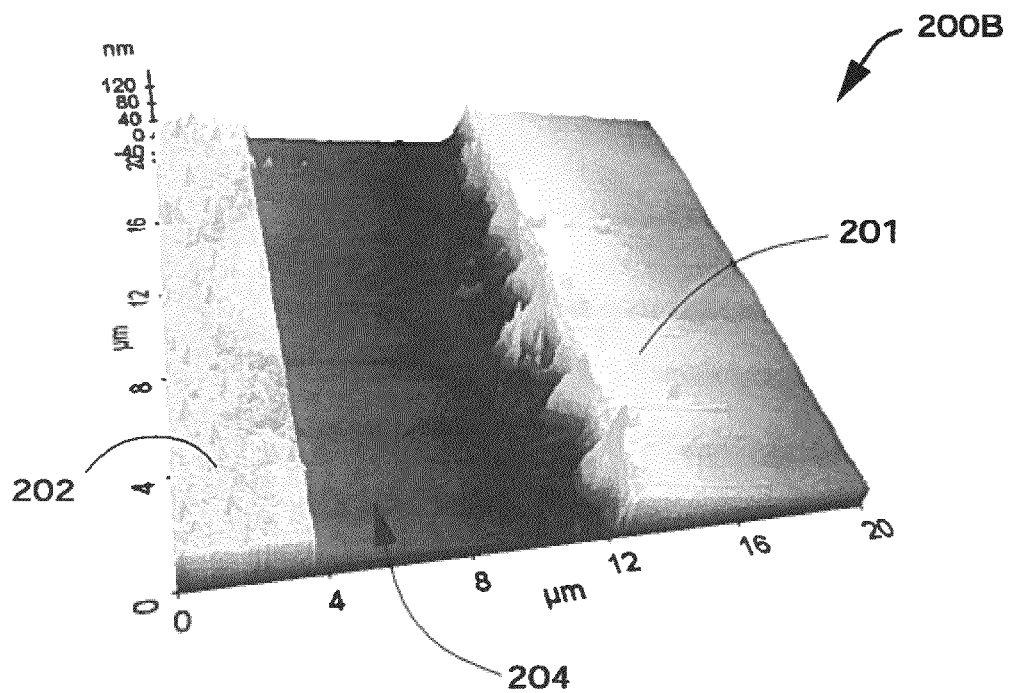
FIG. 2B is an atomic force microscopic image of a portion of the gap and electrodes of the actual nanoionic switch of FIG. 2A (depicted schematically in FIG. 1) with the switch in the "off" state (switch is open).

Referring to FIGS. 2A and 2B, which are photomicrographs and atomic force photos, respectively, of the switch depicted schematically in FIG. 1, the chalcogenide 204 is 100 nm thick and the silver electrode 201 and the nickel electrode 202 are 2 μm thick. So the ternary is much thinner than the electrode.

The fundamental operation of the nanoionic switch is rooted in the phenomenon of ion conduction in solid electrolytes. Synonymous with liquid electrolytes (e.g., lead-acid batteries), solid electrolytes consist of mobile ions which undergo oxidation/reduction reactions at the anode (silver electrode) and cathode (nickel electrode) of the system. The fundamental difference between solid electrolyte and liquid electrolyte behavior is that the mobile ions are of a single polarity while the opposite polarity species remain fixed. The fixed ions essentially create a solid matrix in which mobile ions can "hop" into neighboring potential wells. Based on this short-range hopping mechanism for conduction, the ionic conductivity of solid electrolytes can approach electronic conductivity levels in semiconductors. See, Devices based on mass transport in solid electrolytes, Michael N. Kozicki and Maria Mitkova, Center for Applied Nanoionics, Arizona State University.

Many inorganic and organic materials can conduct ions to some extent. Compounds of elements in the column of the periodic table headed by oxygen, the so-called chalcogens, are used in electrochemical switching devices. Chalcogens are used because of their high ion availability and mobility at normal device operating temperatures. When a metal ion is introduced into the chalcogenide base, the ions nucleate on the chalcogen-rich regions within the base glass, resulting in a ternary that takes the form of a dispersed nanoscale metal ion-rich phase in a continuous glassy matrix. This allows the electrolyte to have a relatively high resistivity (necessary for a high off resistance state), while containing large quantities of highly mobile metal ions for conduction. A base glass of $GeSe_2$, for example, is utilized and saturated with Ag+ ions. For an ion current to flow in an electrolyte, an oxidizable electrode is made positive (anode) with respect to an opposing electrode (cathode) and sufficient bias is applied, typically on the order of a few tenths of a volt or more.

For Ag+saturated $GeSe_2$, the silver anode is oxidized to form an excess of Ag+ ions within the chalcogenide base glass. The applied field causes the silver positive ions to flow toward the cathode through the coordinated hopping mechanism described above. At the cathode, a reduction reaction occurs injecting electrons to re-form silver metal. The number of atoms electrodeposited by the reduction of ions will correspond to the number of electrons that take part in the process (supplied by the external circuit, for example a voltage source or some other electronic component). The electrons are supplied by the direct current or alternating current voltage source. Each metal ion undergoing reduction will be balanced by a metal atom becoming oxidized to avoid the formation of an internal electric field due to the build up of charge. The process continues until the voltage/current limits supplied by the external power source are met. If the current limit is made sufficiently high (~μA), a conductive silver bridge is formed (electrodeposited) which connects (or bridges) the two electrodes. Once this conduction path is formed, no further power is required to maintain it, to wit, it is nonvolatile. To reverse this process, the electro deposit is made positive by switching the polarity of the voltage with respect to the original oxidizable electrode, causing the dissolution of the metal bridge. During the dissolution of the electro deposit, the balance is maintained by deposition of metal back onto the silver electrode. Once the electro deposit has been completely dissolved, the process terminates. For this process to occur, a metal ion-rich anode is required to induce appreciable ion current flow. Further, to be reversible, the opposing electrode (cathode) must be made electrochemically inert (not oxidizable).

FIG. 1 is a schematic top view 100 of the first example of a nanoionic switch. Silver electrode 101, nickel electrode 102 and gap 104 therebetween are illustrated. The electrodes are approximately 1.5-2 µm thick and the ternary is approximately 100 nm thick. Appropriate amounts and thicknesses of the silver film were used such that the photodissolution of the silver will completely saturate the base glass binary. In other words the ternary of FIG. 1 is completely saturated. This is also true of ternaries used in all of the drawings of this patent application. Chalcogenide glass 179 is illustrated applied to a silicon 103 or other substrate. Gap 104 is approximately 10 µm in length.

Figure 1A:
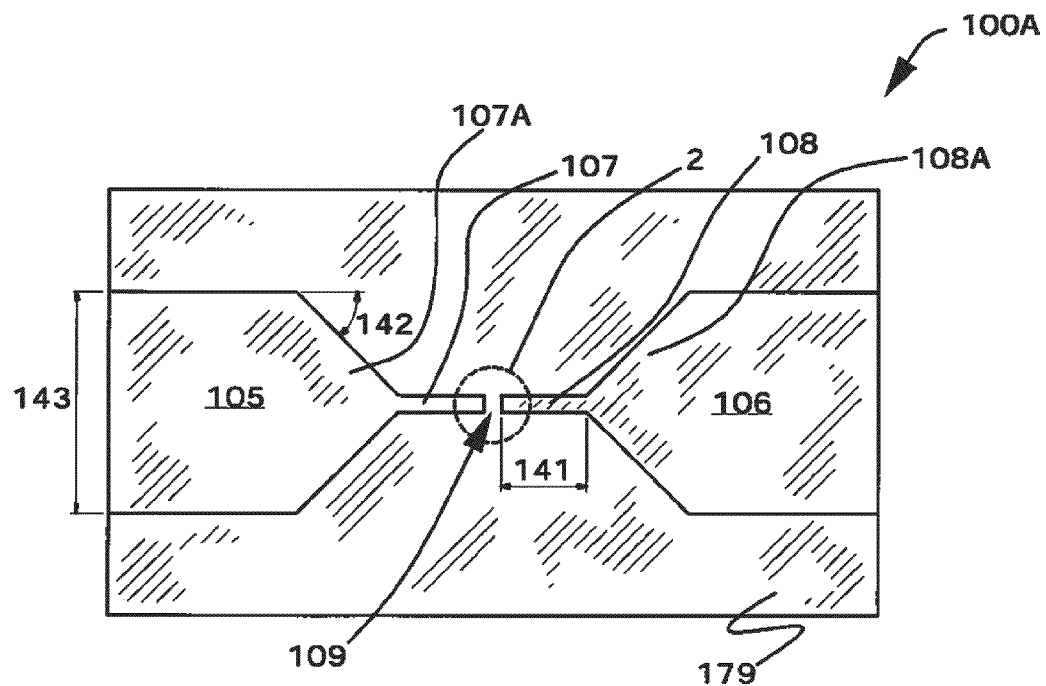
FIG. 1A is a schematic top view of the second example of a nanoionic switch which illustrates than elongated electrodes with a small gap therebetween.

FIG. 1A is a schematic top view 100A of the second example of a nanoionic switch which illustrates narrow portions 108, 107 of the electrodes 105, 106. Electrode 105 is the silver electrode (oxidizable) and electrode 106 is the nickel (inert) electrode. Width 143 of the electrodes is approximately 1 mm. Electrodes 105, 106 include tapered portions 107A, 108A which are tapered at an angle 142 of 22.5°. The tapered portions 107A, 108A terminate in elongated narrow portions 107, 108 which terminate short of contact with each other thus creating a small gap 109 of approximately 10 µm therebetween. Reference numeral 141 indicates that the length of the elongated narrow portions is approximately 50 µm. The width of the narrow portions 108, 107 are 10 µm wide. The width of the narrow portions 108, 107 are preferably 10 ).lm wide but may be in 2-10 µm range. Electrodes 105, 106 and the tapered portions thereof 107A, 108A and the elongated narrow extensions thereof 107, 108 are gold plated. Reference numeral 106A is used in FIGS. 3 and 3A to illustrate the coating of the electrodes but is not used in FIGS. 1A, 1B and 1C, all of which illustrate electrodes with a gold plating, for the sake of clarity. The angle of 22.5°, the width 143 of the electrodes, and the length and width of the elongated extensions 107, 108 have been sized for frequency operation in the range of 1 Mhz to 6 Ghz. Other considerably different geometries may be used without departing from the spirit and the scope of the invention as set forth herein for frequencies of operation outside the range specified herein.

Figure 1B:
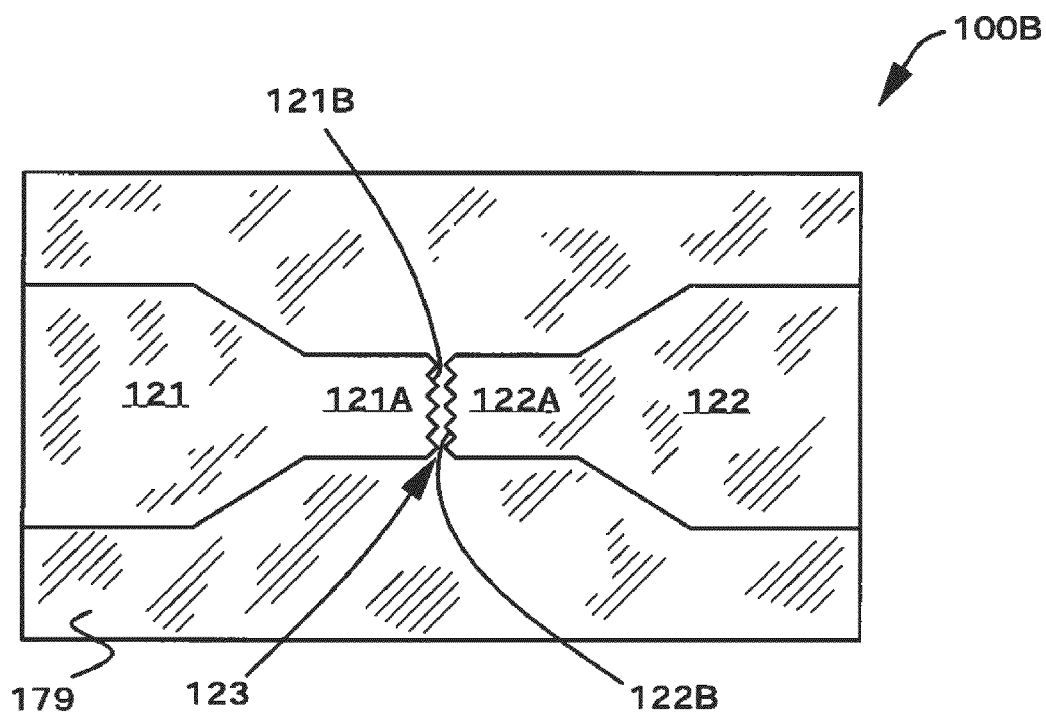
FIG. 1B is a schematic top view of the third example of a nanoionic switch which illustrates electrodes with serrated edges opposed from one another.

FIG. 1B is a schematic top view 100B of the third example of a nanoionic switch which illustrates electrodes with serrated edges 121B, 122B opposed from one another. It will be noted that the serrations of the serrated edges 121B, 122B are matched peak to peak such that the smallest gap 123 is created between peaks and the gap being slightly larger from valley to valley. Still referring to FIG. 1B, the oxidizable gold electrode 121 and the inert electrode 122 are illustrated. Unnumbered tapered portions are illustrated as reducing the width down to elongated extensions 121A, 122A.

Figure 1C:
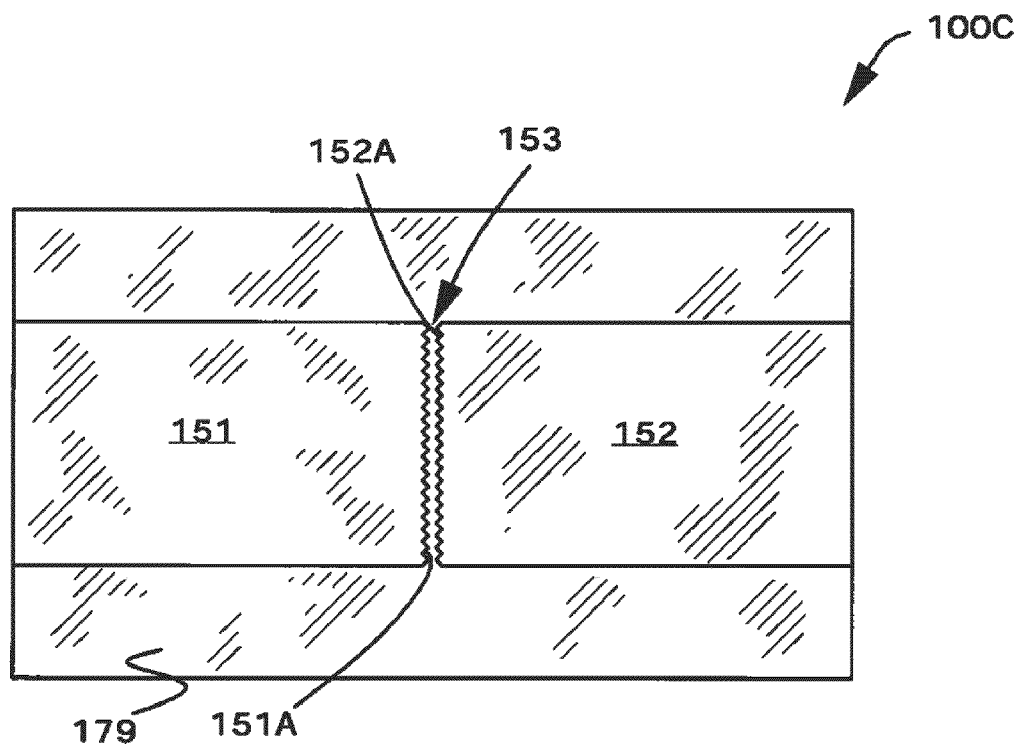
FIG. 1C is a schematic top view of the fourth example of a nanoionic switch which illustrates electrodes with serrated edges of a higher frequency opposed from one another.

FIG. 1C is a schematic top view 1000 of the fourth example of a nanoionic switch which illustrates electrodes 151, 152 with serrated edges 151A, 152A of a higher frequency than that shown in FIG. 1B. The serrated edges 151A and 152A indicate a minimum gap 153 at the peaks thereof as opposed from one another. Further, electrode 151 is the silver oxidizable electrode and electrode 152 is the nickel inert electrode. As in the examples illustrated in FIGS. 1, 1A, and 1B, electrodes 151, 152 sit atop the chalcogenide ternary doped with silver. By doped with silver it is meant that silver has been photo-dissolved within the chalcogenide as discussed elsewhere herein.

Figure 1D:
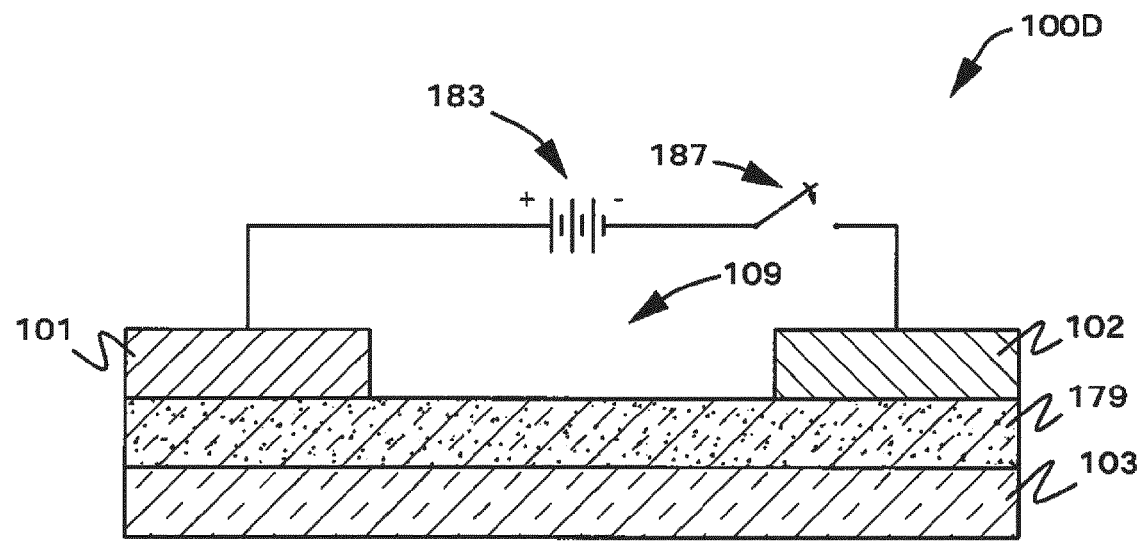
FIG. 1D is a schematic cross-sectional view of the substrate, solid electrolyte, electrodes and a direct current voltage source.
Figure 1E:
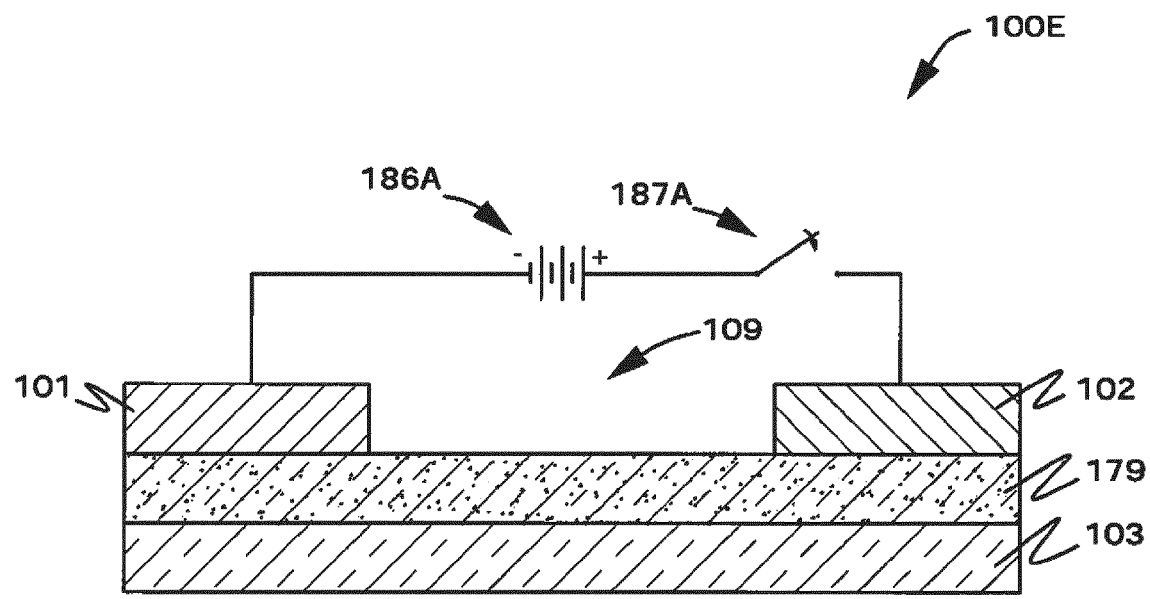
FIG. 1E is a schematic cross-sectional view of the substrate, solid electrolyte, electrodes and a direct current voltage source.

FIG. 1D is a schematic cross-sectional view 100D of the substrate 103, solid electrolyte 179, electrodes 101, 102, switch 187, gap 109 between the electrodes and a direct current voltage source 183. FIG. 1D represents a simple positive bias of the silver oxidizable electrode 101 with respect to the negative bias of the nickel electrode 102. FIG. 1E is a schematic cross-sectional view 100E of the substrate 103, solid electrolyte 179, electrodes 101, 102 and a direct current voltage source 186A. FIG. 1E indicates a positive bias from a voltage source 186A being controlled by switch 187A and applied to the nickel electrode 102 with the potential of the negative portion of the source being tied to the silver oxidizable anode 101. Applying the voltage potential of voltage source 183 across electrodes 101 and 102 causes electrodeposits to "grow" across the gap at the rate set forth by the following equations, where $V_{Ag}$ is the speed of growth in the solid electrolyte 179 and "d" is the size of the gap. The speed of growth, $V_{Ag}$, and the switch time, $t_{switch}$, and resistance, R, of the gap are approximately as follows:

$V_{Ag} \approx 1$ nm/ns $t_{switch} = d/v_{Ag}$ where d=10 µm, then $t_{switch}=10$ µs $R = L/\sigma_m A$, for silver $\sigma_m$ the conductivity is $50 \times 10^5$ S/m, and for electrodeposit in gap 10 µm long, 10 µm wide and 50 nm high, is 1Ω

See FIG. 2 wherein an exemplary gap 281 for the example of FIG. 1A is shown in an enlarged portion of 1A where d=10 µm. FIG. 2 is an enlargement of a portion 200 of FIG. 1A illustrating a gap between the electrodes. Width 282 of the electrode extension 107, 108 is indicated in FIG. 2.

Figure 2C:
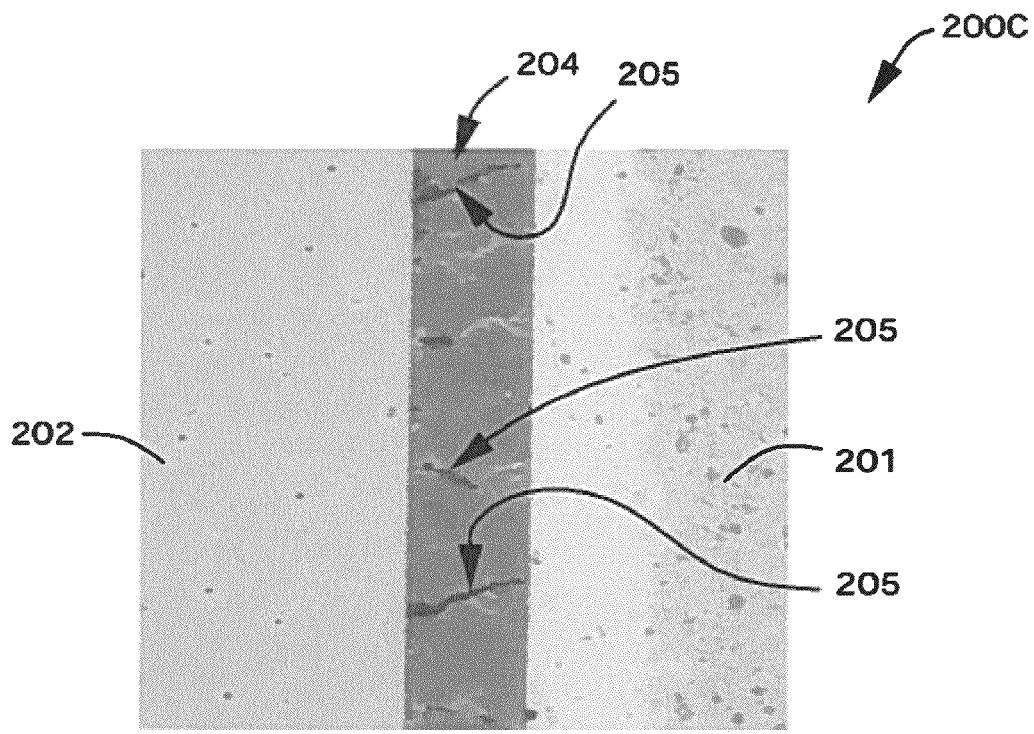
FIG. 2C is a microphotograph of a portion of the silver and nickel electrodes and the gap of the actual nanoionic switch depicted schematically in FIG. 1 in the "on" state (switch is closed).
Figure 2D:
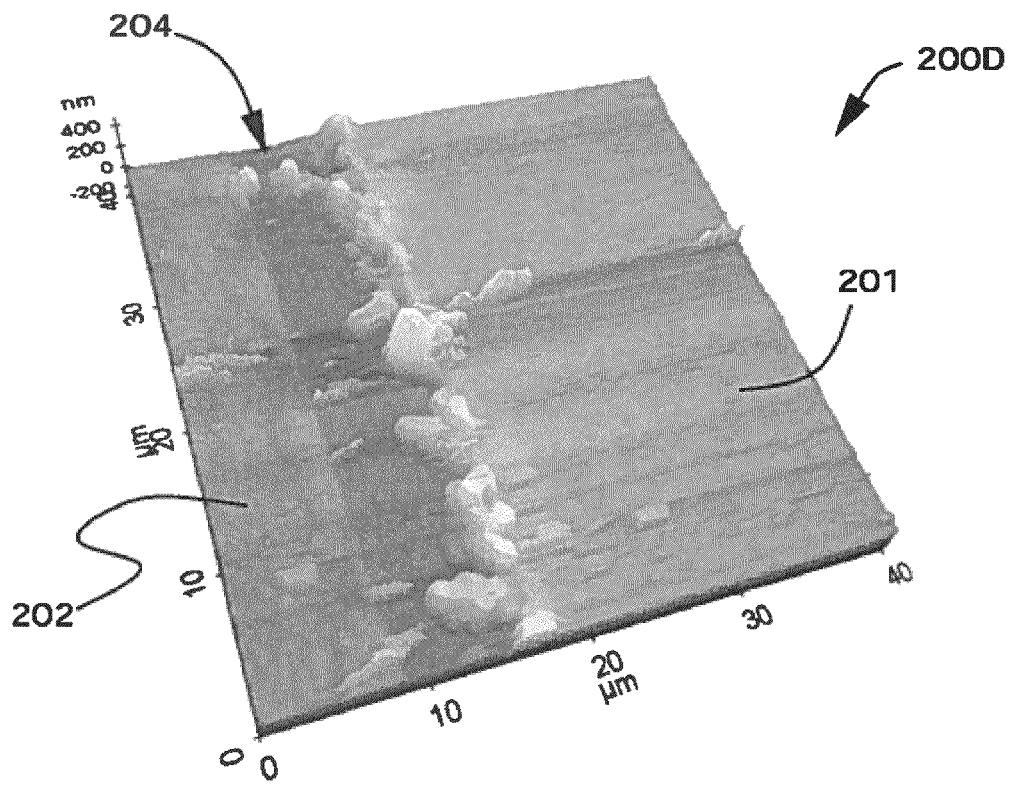
FIG. 2D is an atomic force microscopic image of a portion of the gap and electrodes of the actual nanoionic switch of FIG. 2C depicted schematically in FIG. 1 in the "on" state (switch is closed).

Referring again to FIG. 1D, this means that for a 10 µm gap, the growth of the electrodeposit will take approximately 10 µs. After approximately 10 µs, switch 187 may be opened and no further power is required to maintain conductivity of the switch. FIG. 2C is a microphotograph 200C of a portion of the silver (oxidizable) and nickel (inert) electrodes and the gap 204 of an actual nanoionic switch schematically set forth in FIG. 1 in the "on" state (switch is closed), FIG. 2D is an atomic force microscopic image 200D of a portion of the gap 204 of the nanoionic switch of FIG. 2C with the switch in the "on" state (switch is closed). Filaments 205 are shown in the microphotographs traversing the gap 204 in many areas. These filaments are the growth of silver from the silver electrode 201 illustrated in FIGS. 2C and 2D. The atomic force micrograph illustrates the growth of silver dramatically. In the color micrographs submitted with this patent application FIG. 2C shows the filaments as pinkish in some areas and as darker in other areas. FIG. 2D is the atomic three microscope image and it shows raised structure referred to as dendrites which appears as ridges and cloud-shaped structures. These filaments and ridges (dendrites) are conductive pathways which are established upon the application of bias potential with positive bias applied to the silver electrode 201 (the oxidizable electrode) and with negative bias applied to the nickel electrode 202 in the micrograph of FIG. 2C and the atomic force image of FIG. 2D. Note that FIG. 1 illustrates the silver electrode with reference numeral 101 and the nickel electrode with reference numeral 102.

It is instructive to compare FIG. 2A ("off" state microphotograph of the nanoionic switch) with FIG. 2C ("on" state microphotograph of the switch) and also to compare FIG. 2B ("off" state atomic force image of the switch) with FIG. 2D ("on" state atomic force image of the switch). FIG. 2A is a microphotograph 200A of a portion of the silver 201 and nickel 202 electrodes and the gap 204 of an actual nanoionic switch of the schematically set forth in FIG. 1 depicting the switch in the "off" state (switch is open). FIG. 2B is an atomic force microscopic image 200B of a portion of the gap 204 and of the electrodes 201, 202 of the actual nanoionic switch of FIG. 2A with the switch in the "off" states (switch is open). The gap 204 which is illustrated in the microphotographs as the darker area in black and white and in the darker reddish areas of the color microphotographs filed with this patent application, is the ternary or solid electrolyte which includes the Ag—Ge—Se ternary (Silver-Germanium-Selenium ternary). Germanium and Selenium are a binary into which silver is photodissolved creating a ternary as described herein.

The switch may be returned to its "off" state by applying the positive voltage of source 186A to the nickel electrode 102 and by applying (throwing switch 187A) the negative voltage of source voltage 186A as illustrated in FIG. 1E for a sufficient time as dictated by the switching time as stated above. Switch 187A controls the application of reverse bias in FIG. 1E.

Figure 1F:
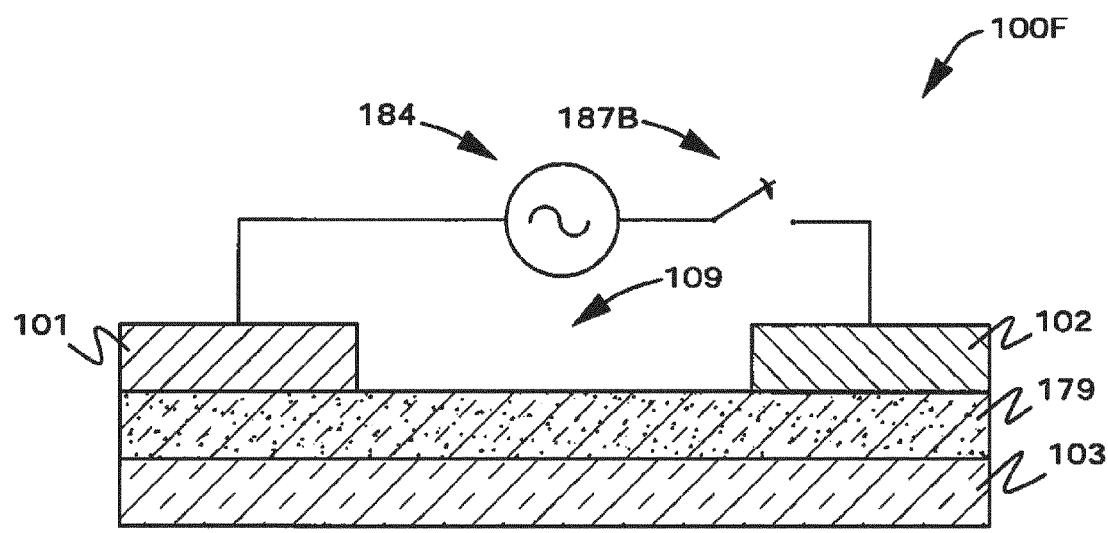
FIG. 1F is a schematic cross-sectional view of the substrate, solid electrolyte, electrodes, switch and a direct current voltage source.

FIG. 1F is a schematic cross-sectional view 100F of the substrate 103, solid electrolyte 179, electrodes 101, 102, switch 187B and an alternating current power supply 184 applied across the electrodes. Referring to FIG. 1F, a sinusoidal voltage source 184 may be applied (controlled by switch 187B) once the growth of silver (or copper) has been established across gap 109 and/or in ternary 179 and after switch 187 has been opened after the electrodeposit is complete. First, the nanoionic switch disclosed herein is a nonvolatile switch meaning once the silver (or copper) has filled the gap, then no further power is required to maintain the switch in the closed position. A sinusoidal signal may be passed through the switch at frequencies greater than the switching time and/or having an rms (root mean square) voltage below the voltage necessary to activate the switch.

The nanoionic switch exhibits switching times according to the equation above and the switching times are on the order of less than 1-10 μs which equate to frequencies of 1 Mhz to 100 khz. See FIG. 8. However, the duration and voltage of the half-cycle of those frequencies must be considered lest the switch might actuate inappropriately. Therefore, for a sinusoidal waveform being passed through the nonvolatile switch the specific switch time for the particular switch must be considered and the rms voltage for the half cycle must be less than the actuation voltage (closing the switch) and the rms voltage for the negative half cycle must be less than the reset actuation voltage (opening the switch). Specifically, if the period of the incoming signal being passed through the nonvolatile switch is too long (the frequency is too low) then the switch will change states and will reset with each cycle of the input signal which is imparted across the switch.

Figure 3:
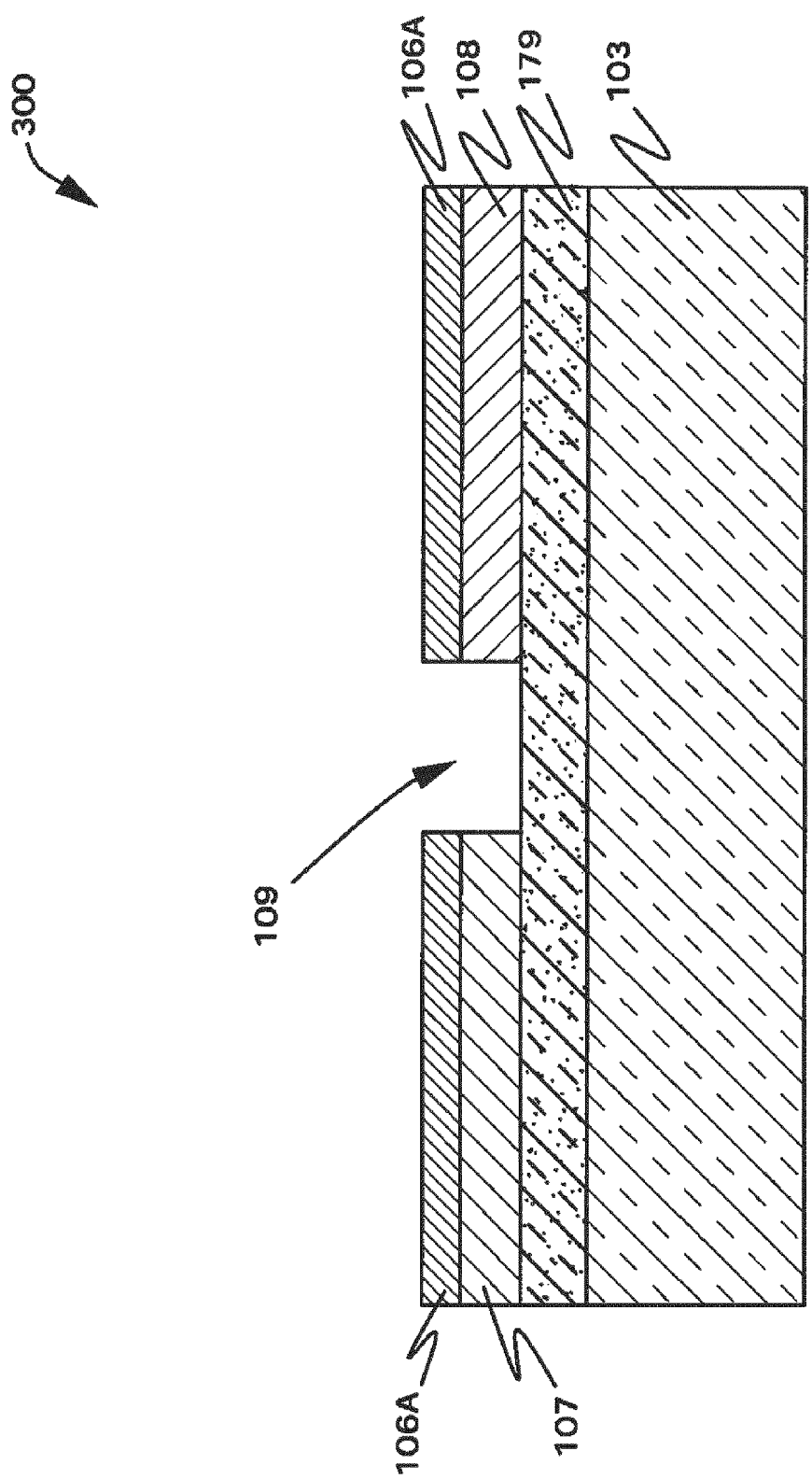
FIG. 3 is a schematic cross-sectional view taken along the lines 3-3 of FIG. 2 illustrating the substrate, the glass-silver electrolyte compound, the gold plated silver electrode and the gold plated nickel electrode.
Figure 3A:
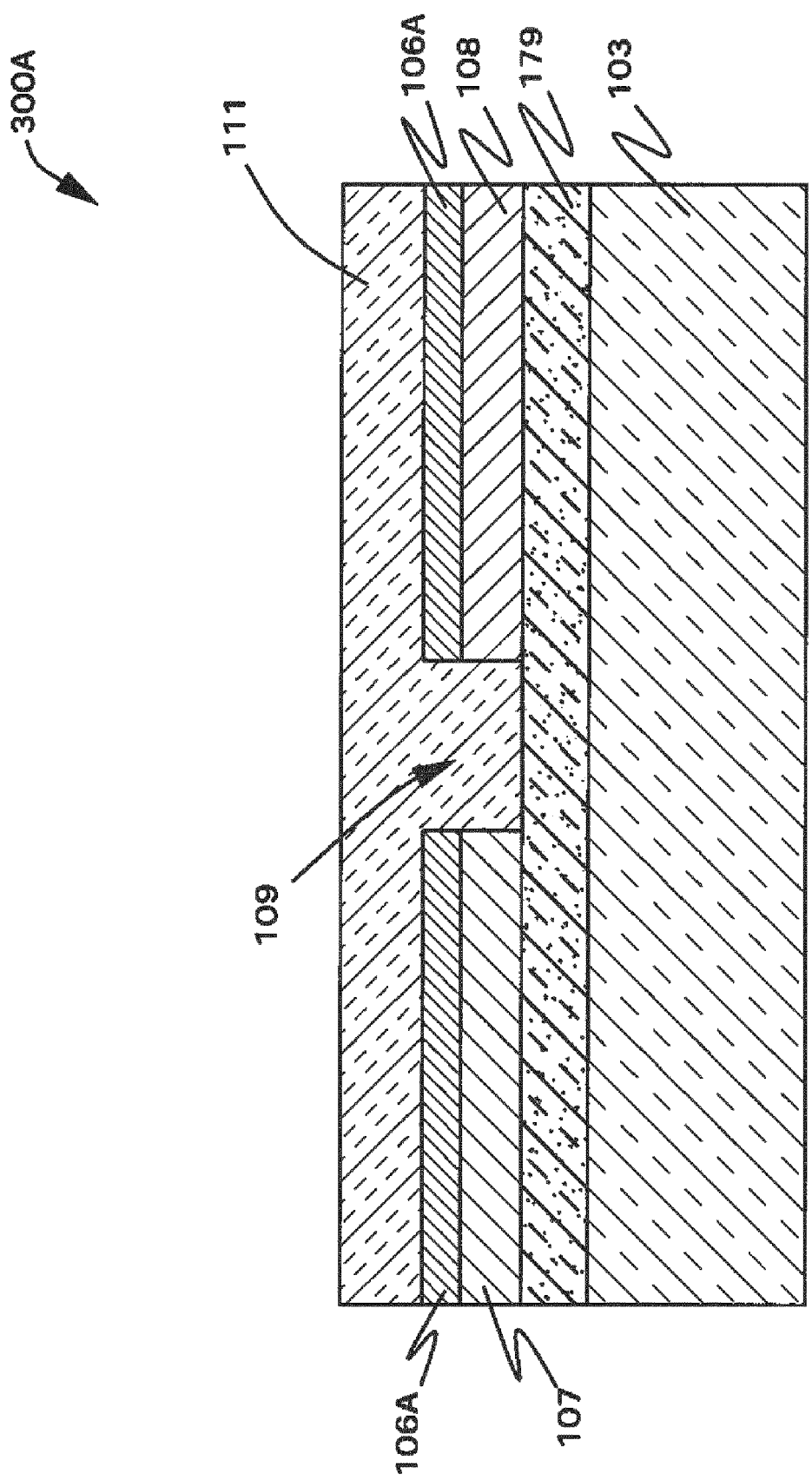
FIG. 3A is schematic cross-sectional view similar to FIG. 3 along with a passivation layer above the electrodes and traversing the gap between the electrodes illustrating the substrate, the glass-silver electrolyte compound, the gold plated silver electrode and the gold plated nickel electrode.

FIG. 3 is a cross-sectional view 300 taken along the lines 3-3 of FIG. 2 illustrating the substrate 103, the glass-silver electrolyte ternary compound 179, the silver electrode 107 and the nickel electrode 108. FIG. 3A is cross-sectional view 300A similar to FIG. 3 along with a passivation layer 111 above the electrodes 107, 108 and traversing the gap 109 between the electrodes illustrating the substrate 103, the glass-silver electrolyte compound 179, the gold plated 106A silver electrode 107 and the gold plated 106A nickel electrode 108. The gold plating is added to the electrodes 107, 108 to reduce ohmic contact losses.

The microwave switch of the invention exploits nanoionic behavior and includes two simple coplanar electrodes. A representative nanoionic switch can be seen in the microphotographs and atomic force photographs of FIGS. 2A, 2B, 2C and 2D. The photographs correspond to the example of FIG. 1. Two electrodes of dissimilar metals (Ag anode, Ni cathode) are plated to 1.5-2.0 μm thick onto a 500 μm thick quartz substrate as illustrated in FIG. 3A. A gap of 10 μm separates the two electrodes. Other separation distances may be used such as those in the range of 0.1 to 500 μm. Within this gap, a thin film (~100 nm) of silver-saturated. $GeSe_2$ glass is deposited which represents the active area of the device. Alternatively, and preferably, the silver saturated glass is deposited first over a wide area of the substrate and then the electrodes are deposited thereover. A 1 mm wide transmission line tapers to a higher impedance (narrowed width, 10 μm) transmission line toward the gap. The tapering effect helps to reduce capacitive coupling in the switch in the "off" state, but remains the primary source of loss in the "on" state (due to a higher resistance because of a narrower channel). A simple silicon dioxide passivation layer atop the "active" area was implemented to provide protection.

By way of example, to operate the device, a voltage of nominally 0.3-1V and a current limit of 10 mA were used. The resistance in the "on" state was approximately 10Ω. Higher voltages induced faster growth rates, whereas higher current limits reduced the overall resistive loss of the electrochemically grown metal, but resulted in higher power requirements to operate the switch.

The application of a positive voltage relative to the Ni (inert) electrode induces silver growth and enables the device to be turned "on." Reversing polarity of the applied voltage removes the electrochemically grown silver and forces the device into the "off" state. FIG. 2C is a microphotograph of the conductive metallic pathways that form when the device is "on". FIG. 2D, an atomic force microscope image after the switch has been closed shows that much of the silver growth occurs on the surface of the thin film of the ternary (Ag—Ge—Se).

To measure the microwave performance of the device, test samples were individually diced and mounted onto a brass mounting fixture. The circuit was connected to an Agilent E8361A Vector Network Analyzer in order to measure "on" state insertion loss and "off" state isolation. An Agilent E3646A DC Power Supply was utilized to provide the necessary voltage/current to change the state of the device (nominally 1 V/10 mA ("on") and −1 V/10 mA ("off")). A plot of these results is shown in FIG. 7 for a typical nanoionic switch. The insertion loss of the switch in the "off" state is better than 0.5 dB over the DC (zero hertz) to 6 GHz range (commercial ISM Band), while the isolation in the "off" state is better than −35 dB. A −0.5 dB insertion loss equates to approximately a 5.9% energy loss with the switch inserted in the circuit meaning that the switch is closed. Similarly, a −35 db isolation loss equates to approximately 1.8% energy loss with the switch open. These measured results are comparable to MEMS and solid state-based RF switch performance in the same frequency range as indicated in FIG. 8.

Power measurements were performed using an Anritsu ML2437A power meter and Anritsu MG3691B signal generator. A switch was mounted on the same brass mounting fixture while various frequencies (500 MHZ-4 GHz) of varying power were fed into a switch. Attenuation pads at the input and output to the switch were used to reduce signal reflection within the system. The results are illustrated in FIG. 7 by the dark linear line. All of the frequencies 500 MHz, 1 GHz, 2 GHz, 3 GHz and 4 GHz) were within the width of the dark line of the plot which indicates linearity over a wide band of frequencies.

Figure 4:
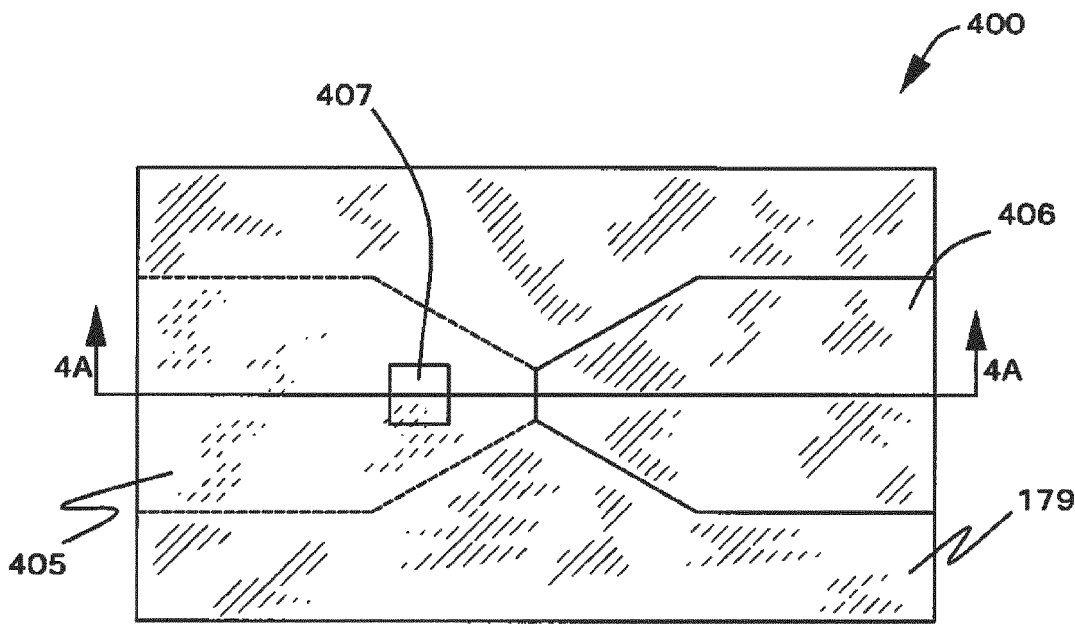
FIG. 4 is schematic top view of the first example of a nanoionic capacitor.
Figure 4A:
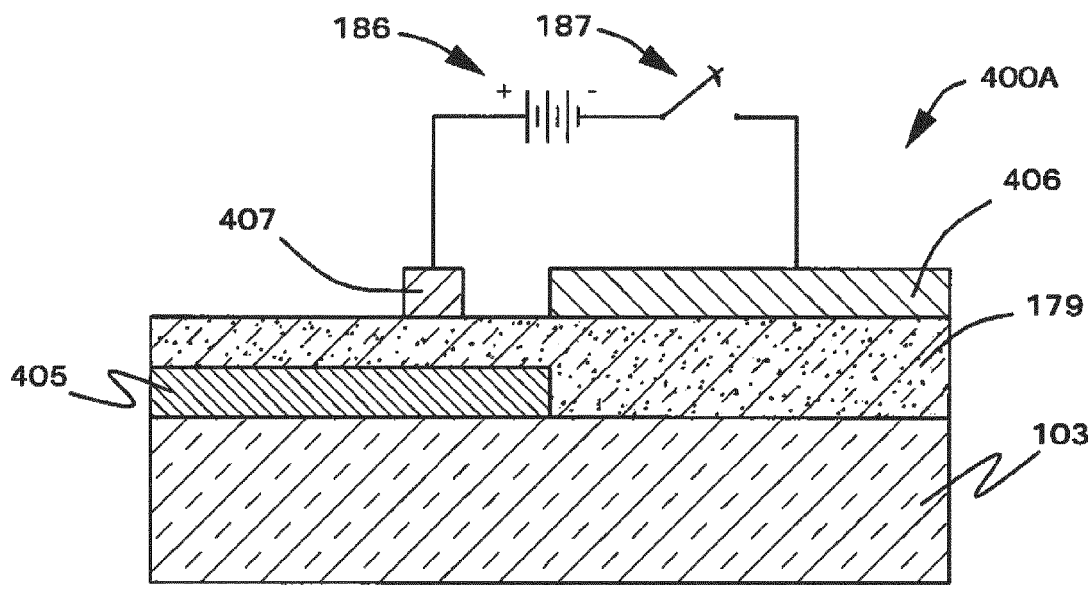
FIG. 4A is a schematic cross-sectional view of the first example nanoionic capacitor of FIG. 4 illustrating electrodes.

FIG. 4 is schematic top view 400 of a first example of nanoionic capacitor. FIG. 4A is a schematic cross-sectional view 400A of the nanoionic capacitor of FIG. 4 illustrating electrodes 407 (anode, oxidizable electrode) and 406 (cathode, inert). As described above, direct current voltage is applied to the oxidizable electrode (silver or copper) 407 and the inert electrode (nickel or tungsten) for a period of time to grow (electrodeposit) the silver from the anode to the cathode across gap 109A thus closing the switch. Once the switch is closed then a capacitor is formed between conductive plate 405 and the plate formed by the electrodeposit which has filled the gap 109A. See FIG. 2D for an illustration of the switch with the electrodeposit "grown" across the gap 204. Once the electrodeposit has been formed, it acts as a capacitor plate as does silver anode 407. The capacitor can them be used for any function normally performed by capacitors such as in band pass filters, coupling capacitors and the like.

FIG. 4B is a top schematic view 400B of a plate (lower plate) of the second example of a capacitor. The lower plate includes transmission lines 420, 440 and a narrower section 430. The narrowed section 430 of plate has the same shape as the electrodeposited plate in gap 109. Essentially the capacitor of the second example includes the nanoionic switch of FIG. 3 and the capacitor plate depicted in FIG. 4B separated by a dielectric. FIG. 4C is a top schematic view 400C of the nanoionic switch which forms one of the two capacitor plates (namely, the upper plate) of the second example of the nanoionic capacitor. FIG. 4C illustrates the oxidizable silver or copper anode 107 separated by a gap 109 from the inert electrode 108 (nickel or tungsten), FIG. 4D is a top schematic view 400D of the capacitor plates (of FIGS. 4B and 4C) illustrated in an overlapping position crossing each other in an orthogonal relationship. FIG. 4E is a cross-sectional view 400E of the capacitor taken along the lines 4E-4E of FIG. 4D illustrating the upper plate (formed from the growth of the electrodeposit (not shown)) and the lower plate 430. Shoulders 431, 432 are illustrated in FIGS. 4D and 4E and they represent the taper of the lower plate of the capacitor. When the electrodeposit is grown two plates exist, the first plate being the electrodeposit and the second plate being the narrow section 430 of the lower plate. It should be noted that the capacitor of the second example of FIGS. 4B-4E is made of similarly shaped plates in that they are both rectangular in cross-section. Further, it should be noted that FIG. 4C is similar in shape to the profiles illustrated in FIG. 2 and in FIG. 1A. As indicated herein the shape of the wider portions of the conductors 420, 440 and their tapered (unnumbered) and narrow portion 430 is similar to the wider portions 105, 106, the tapered portions 107A, 108A and the narrow portions 107, 108. See FIGS. 4B-4E and FIGS. 1A and 2. The plates just described are separated by a dielectric 490. Alternatively, no dielectric is necessary as the substrate 103 is a dielectric and the ternary to the extent the silver or copper doping does not extend therethrough is a dielectric.

FIG. 6 is a plot 600 of insertion loss (switch closed or "on") and the isolation (switch open or "off") for frequencies between 1 and 6 Ghz, FIG. 7 is a generalized plot 700 of power in versus power out for four frequencies (500 MHZ, 1 GHz, 2 GHz and 40 GHz). From FIG. 7, it can be seen that devices typically demonstrated linearity over the range of measured power from −20 dBm to +20 dBm, with device breakdown typically occurring at ~400-500 mW. Further, no change is evident in the power transfer curve at different frequencies of operation, demonstrating the device's wide bandwidth operation potential.

The speed of operation of the nanoionic switch is a function of the distance the electrodeposit has to traverse. Or, put another way, the electrodeposit has to grow a certain distance within the ternary or on top of the ternary. That is, the wider the gap between electrodes, the longer the response time of the switch. Although the switching speed was not directly measured, results inferred from M. N. Kozicki, M. Yana, L. Hilt, A. Singh, "Application of programmable resistance changes in metal-doped chalcogenides," Proceedings of the 1999 Symposium on Solid State Ionic Devices, Electrochemical Society Proceeding, Vol. 99-13, p. 298 (1999), indicate that the electrodeposition rate of silver within a chalcogenide glass occurs at a velocity of approximately 1 nm/ns. Therefore, for a 10 μm gap, a switching speed of around 10 μs is expected. Obviously the smaller the gap size, the faster the switch operation, but other considerations such as "off" state isolation limit the optimization of speed at least for a coplanar-type structure.

Figure 5:
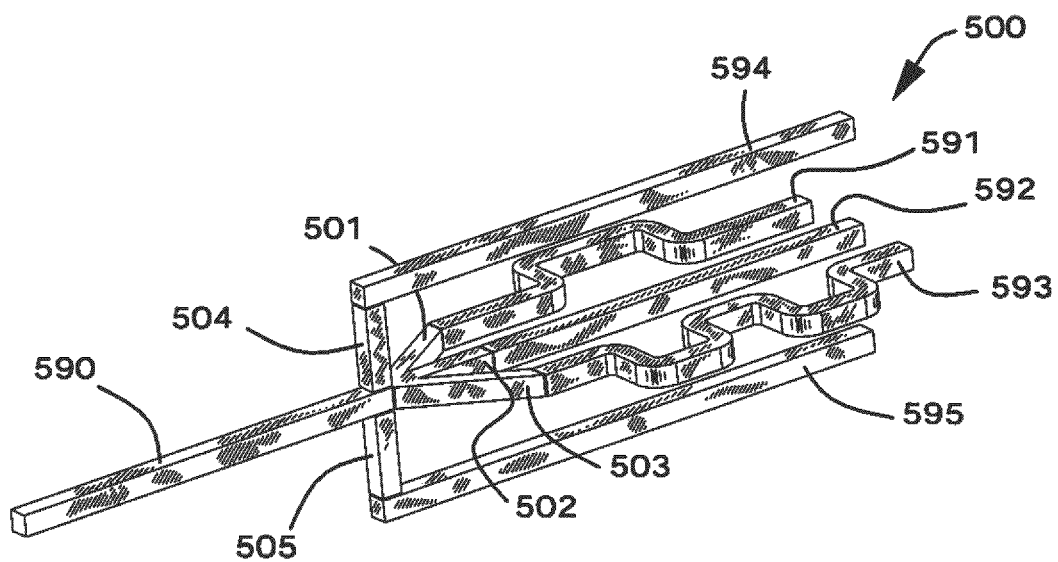
FIG. 5 is a schematic of a vertical and horizontal switch to various lines having different lengths to accommodate phase shifting.
Figure 5A:
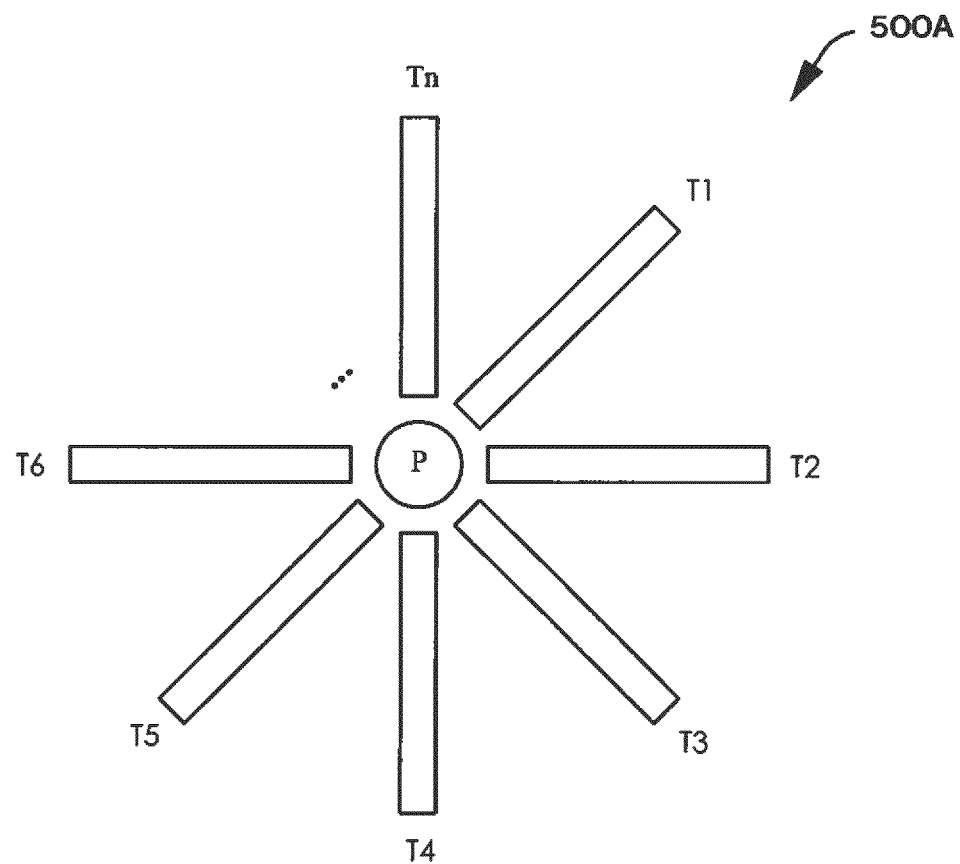
FIG. 5A is a schematic of a single pole "N" throw nanoionic switch.

FIG. 5A is a schematic 500A of a single-pole, "N" throw nanoionic switch. In FIG. 5A, "P" represents the pole or anode and T1 through Tn represents "N" possible throws. Since the active switching element is comprised of simply a thin film area, the addition of extra electrodes (ports or throws "N") in contact with the active area makes possible the creation of SPNT (single-pole-n-throw-switches), as shown in the diagram of FIG. 5A. Application of the necessary voltage across the electrodes results in a conductive pathway which can be formed/dissolved amongst one of several different paths limited only by available space and maximum coupling level requirements. Further, the ability to deposit "vias" of this nanoionic material allows for the formation of multilayer control circuits. "Vias" are the through-hole paths to other surfaces of an integrated circuit having multiple layers. Use of a switching network in a horizontal and a vertical fashion has the advantage of compacting circuit footprints and reducing overall circuit losses. The disclosure of the nanoionic switch herein represents an unprecedented ease of integration.

FIG. 5 illustrates a potential SP5T nanoionic switch 500, showing multiple horizontal, as well as vertical, switching paths. One such application for this switch is in low-loss phased array technology. For conventional discrete phase shifters based on a solid state or MEMS approach, approximately 2N switches are required for an N-bit phase shifter, with 2-3 control lines per switch, contributing to the overall loss and complexity of the circuit. Implementation of the nanoionic topology described herein results in an N-bit phase shifter with only one nanoionic switch and N+2 control lines. A control line is required for each of the N-bits. Additionally, a control line is also necessary to switch positive potential to the pole (oxidizable electrode) and another control line is needed to switch negative potential for a bus interconnected with the phase shifters (inert electrode). This example discloses the structure necessary for minimizing losses as the insertion loss of each of the phases is low and the line losses (and not switch losses) will be the primary contributor to total phase shifter loss.

Referring to FIG. 5, the nanoionic switch is formed as first throw 501, second throw 502, third throw 503, fourth throw 504, and fifth throw 505. Each of these throws is a nanoionic switch wherein an electrodeposit is grown over and through respective horizontal or vertical gaps. Each switch operates between (anode, oxidizable pole) 590 and a first delay line 591, a second delay line 592, third delay line 593, fourth delay line 594, and fifth delay line 595.

Reference Numerals

100—a top view of the first example of a nanoionic switch.

100A—a top view of the second example of a nanoionic switch which illustrates thin elongated electrodes with a small gap therebetween.

100B—a top view of the third example of a nanoionic switch which illustrates electrodes with serrated edges opposed from one another.

100C—a top view of the fourth example of a nanoionic switch which illustrates electrodes with serrated edges of a higher frequency opposed from one another.

100D—a cross-sectional view of the substrate, solid electrolyte, electrodes and a direct current power supply.

100E—a cross-sectional view of the substrate, solid electrolyte, electrodes and an alternating current power supply.

101—silver electrode
102—nickel electrode
103—silicon or other substrate
104—gap between electrodes 101 and 102
105, 121, 151—gold plated silver electrode
106, 122, 152—nickel plated electrode
106A—gold plating on electrodes
107—elongated extension of the gold plated silver electrode 105
107A—tapered width of the gold plated silver electrode 105
108—elongated extension of the gold plated nickel electrode 105
108A—tapered width of the gold plated nickel electrode 105
109—gap between tapered elongated extension 107 of the silver electrode 105 and the tapered elongated extension 108 of the nickel electrode 105
109A—elongated extension of the gold plated silver electrode 121A
109B—serrated edge of elongated extension 121A of gold plated silver electrode
122A—elongated extension of the gold plated nickel electrode 122
123—gap between elongated extension 122A of the gold plated nickel electrode 122 and the elongated extension 121A of the gold plated silver electrode 121
122B—serrated edge of elongated extension 122A of gold plated silver electrode
141—typical length of elongated extension 108, 107
142—taper angle
143—width of electrode 105, 106
143A—serrated edge of gold plated silver electrode 151
152A—serrated edge of gold plated nickel electrode 152
153—gap between edge of gold plated electrodes
179—chalcogenide glass with silver or copper
183, 186, 186A, 408—direct current voltage source
184—alternating current voltage source
187, 187A—switch
200—an enlargement of a portion of FIG. 1A illustrating a gap between the electrodes
200A—a microphotograph of a portion of the gold plated silver and nickel electrodes and the gap
200B—nanoionic switch of FIG. 1A in the "off" state (switch is open).
200C—microphotograph of a portion of the gold plated silver and nickel electrodes and the gap of the nanoionic switch of FIG. 1A in the "on" state (switch is closed).
200D—an atomic force microscopic image of a portion of the gap of the nanoionic switch of FIG. 2C with the switch of FIG. 1A in the "on" state (switch is closed).
201—silver electrode
202—nickel electrode
205—conductive filaments
281—distance of gap 109 between elongated extensions 107, 108 of the electrodes
282—width of extension 107, 108 of the electrodes 300—a cross-sectional view taken along the lines 3-3 of FIG. 2 illustrating the substrate, the glass-silver electrolyte compound, the silver electrode and the nickel electrode
300A—cross-sectional view similar to FIG. 3 along with a passivation layer above the electrodes and traversing the gap between the electrodes illustrating the substrate, the glass-silver electrolyte compound, the gold plated silver electrode and the gold plated nickel electrode.
400—a top view of a schematic of first example of a nanoionic capacitor.
400A—a cross-sectional view of the first example of the nanoionic capacitor of FIG. 4 illustrating electrodes and a plate which for the capacitor along with a ternary residing therebetween.
400B—a top schematic view of a plate of the lower plate of the capacitor.
400C—a top schematic view of the nanoionic switch which forms one of the two capacitor plates (namely, the upper plate).
400D—a top schematic view of the capacitor plates illustrated in the overlapping position crossing each other in an orthogonal relationship,
400E—a cross-sectional view of the capacitor taken along the lines 4E-4E of FIG. 4D.
405—capacitor plate
406—nickel electrode/capacitor plate
407—overlapping of electrode/capacitor plate
409—switch
420, 440—transmission lines of capacitor plate having similar shape to anode 107 and cathode 108 430—narrowed section of plate having same shape as electrodeposited plate in gap 109
431, 432—shoulders of transmission line 420
490—dielectric
500—a schematic of a single pole "5" throw nanoionic switch with phase shifting due to different line lengths
500A—single pole, "n" throw switch
501—first throw
502—second throw
503—third throw
504—fourth throw
505—fifth throw
590—pole
591—first delay line
592—second delay line
593—third delay line
594—fourth delay line
595—fifth delay line
P—single pole
T1, T2, T3, T4, T5, T6, . . . Tn—"n" throws
600—a plot of insertion loss (switch closed of "on") and the isolation (switch open or "off") for frequencies between 1 and 6 Ghz
700—a generalized plot of power in versus power out for four frequencies (500 MHZ, 1 GHz, 2 GHz and 40 Hz) which are combined in a single line.
800—a table comparing electronic, physical and cost properties of MEMS, Solid State, and Nanoionics switches Those skilled in the art will readily recognize that the invention has been set forth by way of examples only and that changes may be made to the invention without departing from the spirit and scope of the appended claims.

The invention claimed is:

1. A nanoionic switch, comprising:
a substrate;
a solid electrolyte ternary, said solid electrolyte ternary includes a chalcogenide glass engaging said substrate;

said chalcogenide glass includes a metal selected from the group consisting of silver and copper photo-dissolved in said chalcogenide glass;
a first oxidizable electrode and a second inert electrode, said first oxidizable electrode and said second inert electrode residing atop and engaging said chalcogenide glass and being spaced apart from each other forming a gap therebetween;
a voltage source applied to said first and second electrodes, wherein said voltage source is a direct current voltage source interconnecting a direct current bias across said oxidizable and inert electrodes of said switch, said direct current bias oriented across said switch by applying positive bias to said oxidizable electrode and applying relative negative bias to said inert electrode;
wherein a second voltage source is applied to said first and second electrodes an said second voltage source is an alternating current voltage source;
wherein said first and second electrodes each include a wide portion, a tapered portion and a narrow portion sized a function of the frequency of the alternating current signal and said wide portions are approximately 1 mm wide, said tapered angles are 22.5°, and said narrow portions are 10 μm wide.

2. A nanoionic switch as claimed in claim 1 wherein said chalcogenide glass is selected from the group consisting of Ge—Se, Ge—S, and Si—O binaries.

3. A nanoionic switch as claimed in claim 2 wherein said chalcogenide glass selected from the group consisting of Ge—Se, Ge—S, and Si—O is saturated with an amount of said metal selected from the group of silver and copper photo-dissolved in said chalcogenide glass.

4. A nanoionic switch as claimed in claim 1 wherein said first oxidizable electrode is a silver electrode and said second electrode is a nickel electrode.

5. A nanoionic switch as claimed in claim 4 wherein said first silver oxidizable electrode includes a gold plating thereover and said second nickel electrode includes a gold plating thereover.

6. A nanoionic switch as claimed in claim 1 wherein said direct current voltage source is 1 Volt direct current.

7. A nanoionic switch as claimed in claim 1 wherein said direct current voltage is 0.3 Volts direct current.

8. A nanoionic switch as claimed in claim 1 wherein said chalcogenide glass and said metal selected from the group consisting of silver and copper photo-dissolved in said chalcogenide glass includes silver in and on said chalcogenide glass bridging said electrodes.

9. A nanoionic switch as claimed in claim 1 wherein said gap is approximately 10 μm.

10. A nanoionic switch as claimed in claim 1 wherein said chalcogenide glass is approximately 50 to 100 nm thick.

11. A nanoionic switch as claimed in claim 1 wherein said electrodes are approximately 1.5 to 2 μm thick.

* * * * *